US010059852B2

(12) United States Patent
Gong et al.

(10) Patent No.: US 10,059,852 B2
(45) Date of Patent: Aug. 28, 2018

(54) METAL COMPOUND, METHOD FOR PREPARING THE SAME, SELECTIVE METALLIZATION OF SURFACE OF SUBSTRATE WITH THE METAL COMPOUND

(71) Applicants: SHENZHEN BYD AUTO R&D COMPANY LIMITED, Shenzhen, Guangdong (CN); BYD COMPANY LIMITED, Shenzhen, Guangdong (CN)

(72) Inventors: Qing Gong, Guangdong (CN); Wei Zhou, Guangdong (CN); Bifeng Mao, Guangdong (CN); Weifeng Miao, Guangdong (CN)

(73) Assignees: Shenzhen BYD Auto R&D Company Limited, Shenzhen, Guangdong (CN); BYD Company Limited, Shenzhen, Guangdong (CN)

(*) Notice: Subject to any disclaimer, the term of this patent is extended or adjusted under 35 U.S.C. 154(b) by 253 days.

(21) Appl. No.: 14/242,763

(22) Filed: Apr. 1, 2014

(65) Prior Publication Data
US 2014/0290530 A1    Oct. 2, 2014

(30) Foreign Application Priority Data
Apr. 2, 2013    (CN) .......................... 2013 1 0113641

(51) Int. Cl.
*C23C 18/40*     (2006.01)
*H05K 3/18*      (2006.01)
(Continued)

(52) U.S. Cl.
CPC .......... *C09D 11/322* (2013.01); *B01J 23/002* (2013.01); *B01J 23/825* (2013.01); *B01J 23/868* (2013.01);
(Continued)

(58) Field of Classification Search
CPC ..................................................... C01G 3/006
See application file for complete search history.

(56) References Cited

U.S. PATENT DOCUMENTS 4,748,144 A *   5/1988   Monnier ............... B01J 23/002
                                                       502/316
6,489,057 B1   12/2002   Yamada et al.
(Continued)

FOREIGN PATENT DOCUMENTS

CN          1916057 A       2/2007
CN        101684551 A       3/2010
(Continued)

OTHER PUBLICATIONS

Leske et al., "Synthesis, Characterization, Electronic Structure, and Photocatalytic Behavior of CuGaO2 and CuGa1—xFexO2 (x= 0.05, 0.10, 0.15, 0.20) Delafossites," The Journal of Physical Chemistry C 116(2), pp. 1865-1872, Dec. 2011.*
(Continued)

*Primary Examiner* — Colin W. Slifka
(74) *Attorney, Agent, or Firm* — Sheppard, Mullin, Richter & Hampton LLP

(57) ABSTRACT

The present disclosure provides a metal compound. The metal compound is represented by a formula (I): $Cu_2A_\alpha B_{2-\alpha}O_{4-\beta}$ (I). A contains at least one element selected from the groups 6 and 8 of the periodic table. B contains at least one element selected from the group 13 of the periodic table, $0<\alpha<2$, and $0<\beta<1.5$. Polymer article containing the metal compound and method for preparing the polymer article as well as selective metallization of a surface of the polymer article are also provided. In addition, the present disclosure provides an ink composition and the selective metallization for a surface of the insulative substrate using the ink composition.

20 Claims, 6 Drawing Sheets

Providing a mixture of $Cu_2O$, an oxide of A and an oxide of B — S101

Sintering the mixture — S102

(51) Int. Cl.
C09D 11/322 (2014.01)
C23C 18/18 (2006.01)
C23C 18/16 (2006.01)
C23C 18/20 (2006.01)
C01G 37/00 (2006.01)
C01G 39/00 (2006.01)
C01G 49/00 (2006.01)
C01G 15/00 (2006.01)
C09D 11/10 (2014.01)
B01J 37/34 (2006.01)
B01J 37/04 (2006.01)
B01J 37/08 (2006.01)
B01J 23/00 (2006.01)
B01J 23/825 (2006.01)
B01J 23/86 (2006.01)
B01J 23/887 (2006.01)
B01J 35/02 (2006.01)
B01J 37/00 (2006.01)
B01J 31/06 (2006.01)

(52) U.S. Cl.
CPC ....... *B01J 23/8874* (2013.01); *B01J 23/8878* (2013.01); *B01J 31/06* (2013.01); *B01J 35/023* (2013.01); *B01J 37/0036* (2013.01); *B01J 37/04* (2013.01); *B01J 37/08* (2013.01); *B01J 37/349* (2013.01); *C01G 15/006* (2013.01); *C01G 37/006* (2013.01); *C01G 39/006* (2013.01); *C01G 49/009* (2013.01); *C09D 11/10* (2013.01); *C23C 18/1608* (2013.01); *C23C 18/1612* (2013.01); *C23C 18/1641* (2013.01); *C23C 18/1879* (2013.01); *C23C 18/204* (2013.01); *C23C 18/206* (2013.01); *H05K 3/182* (2013.01); *H05K 3/185* (2013.01); *B01J 2523/00* (2013.01); *C01P 2004/61* (2013.01); *C01P 2004/62* (2013.01); *C01P 2006/60* (2013.01); *C01P 2006/80* (2013.01); *C23C 18/1651* (2013.01); *C23C 18/1653* (2013.01); *H05K 2201/0236* (2013.01); *H05K 2201/09118* (2013.01); *H05K 2203/0709* (2013.01); *H05K 2203/107* (2013.01); *H05K 2203/1131* (2013.01); *H05K 2203/125* (2013.01)

(56) References Cited

U.S. PATENT DOCUMENTS

2004/0241422 A1 12/2004 Naundorf et al.
2011/0281135 A1* 11/2011 Gong ............... B01J 23/80
428/626
2012/0183793 A1 7/2012 John et al.

FOREIGN PATENT DOCUMENTS

CN 102432057 A 5/2012
JP H 03-93683 A 4/1991
WO WO 2010/022641 A1 3/2010

OTHER PUBLICATIONS

Ketir et al., "Photocatalytic removal of M2+ (=Ni2+, Cu2+, Zn2+, Cd2+, Hg2+ and Ag+) over new catalyst CuCrO2," Journal of Hazardous Materials 158(2-3), pp. 257-263, Oct. 2008.*
Buljan et al., "Electronic Structure and Bonding in $CuMO_2$ (M=Al, Ga, Y) Delafossite-Type Oxides: An Ab Initio Study", *J. Phys. Chem. B*, vol. 103, 1999, pp. 8060-8066.
Lalanne et al., "Synthesis and Thermostructural Studies of a $CuFe_{1-x}Cr_xO_2$ Delafossite Solid Solution with $0 \leq x \leq 1$", *Inorganic Chemistry*, vol. 48, Jun. 2009, pp. 6065-6071.
E. Mugnier et al., Synthesis and Characterization of $CuFeO_{2+\sigma}$ Delafossite Powders, Solid State Ionics, 2006, pp. 607-612, vol. 177, Elsevier.
Jonathan W. Lekse et al., Synthesis, Characterization, Electronic Structure, and Photocatalytic Behavior of $CuGaO_2$ and $CuGa_{1-x}Fe_xO_2$ (x=0.05, 0.10, 0.15, 0.20) Delafossites, The Journal of Physical Chemistry, 2012, pp. 1865-1872, vol. 116, American Chemical Society.
Yo Bo et al., Studies on the Preparation of Active Oxygen-deficient Copper Ferrite and its Application for Hydrogen Production Through Thermal Chemical Water Splitting, Science in China Series B; Chemistry, Sep. 2008, pp. 878-886, vol. 51—Issue No. 9, Science in China Press.

* cited by examiner

METAL COMPOUND, METHOD FOR PREPARING THE SAME, SELECTIVE METALLIZATION OF SURFACE OF SUBSTRATE WITH THE METAL COMPOUND

CROSS REFERENCE TO RELATED APPLICATIONS

This application claims priority to and benefits of Chinese Patent Application No. 201310113641.3, filed with the State Intellectual Property Office of China on Apr. 2, 2013. The entire content of the above-referenced application is incorporated herein by reference.

FIELD

The present disclosure generally relates to the field of a metal compound, a method for preparing the metal compound, and use of the metal compound. The present disclosure also relates to a polymer article containing the metal compound and a method for preparing the polymer article as well as a method for selective metallization of a surface of the polymer article, and to an ink composition containing the metal compound. The present disclosure also relates to a method for selective metallization of a surface of an insulative substrate.

BACKGROUND

Polymer articles with a surface deposited with metal layers, which are used for conducting electro-magnetic signals, are widely used in fields like automobile, computer, communications, etc. Forming the metal layer selectively on the surface of the polymer article is the key step in the manufacturing of these polymer articles.

U.S. Patent Application Publication No. 2004/0241422 to Naundorf et al., entitled "Conductor Track Structures And Method for Production Thereof," discloses a method for preparing a polymer article, which includes steps of: adding an inorganic compound having a spinel structure and containing Cu, Ni, Co, Cr, Fe, etc. to a polymer matrix, and activating the inorganic compound with an ultraviolet laser (with wave lengths of 248 nm, 308 nm, 355 nm, 532 nm) and an infrared laser (with wave lengths of 1064 nm and 10,600 nm). Specifically, Naundorf mentioned that the oxides having spinel structures should be reduced into metal under the effect of laser. Then the metal may act as a metal core, onto which metal may be deposited during a chemical plating process. However, the method needs very strict control on the process condition. Further, the energy of the laser has to be high enough to reduce the oxides having a spinel structure into pure metal. Therefore, the method has rather stringent requirements for the manufacturing instrument and the processing condition.

Therefore, there is a need for a process for metallization of a surface of the polymer article which has less stringent requirement for the manufacturing instrument and the processing condition.

SUMMARY

Embodiments of the present disclosure seek to solve at least one of the problems existing in the prior art to at least some extent, or to provide a consumer with a useful commercial choice.

According to embodiments of the present disclosure, a metal compound is provided. The metal compound may have a formula (I): $Cu_2A_\alpha B_{2-\alpha}O_{4-\beta}$ (I). In some embodiments, A may contain one or two or more elements selected from the groups 6 and 8 of the periodic table. In some embodiments, B may contain one or two or more element selected from the group 13 of the periodic table. In some embodiments, $0<\alpha<2$. In some embodiments, $0<\beta<1.5$.

According to embodiments of the present disclosure, a method for preparing a metal compound is provided. The method may include the steps of: providing a mixture of $Cu_2O$, an oxide of A and an oxide of B with a molar ratio of 100:2-90:3-80, and sintering the mixture under a non-reactive atmosphere. In some embodiments, A may contain at least one element selected from the groups 6 and 8 of the periodic table. In some embodiments, B may contain at least one element selected from the group 13 of the periodic table. In some embodiments, the mixture may further contain CuO, and based on the total weight of the metal compound, the content of the CuO is less than about 0.01 mol %.

According to embodiments of the present disclosure, a metal compound obtained by a method according to embodiments of the present disclosure for preparing a metal compound is provided.

According to embodiments of the present disclosure, a metal compound obtained by a method according to embodiments of the present disclosure for preparing a metal compound is provided for selective metallization of a surface of an insulative substrate. According to embodiments of the present disclosure, a polymer article is provided. In some embodiments, the polymer article may contain a polymer matrix and a metal compound obtained by a method according to embodiments of the present disclosure for preparing a metal compound, wherein the metal compound is dispersed in the polymer matrix.

According to embodiments of the present disclosure, a method for preparing a polymer article is provided. The method may include the steps of: providing a mixture containing a polymer matrix and a metal compound obtained by a method according to embodiments of the present disclosure for preparing a metal compound, and molding the mixture.

According to embodiments of the present disclosure, a polymer article obtained by a method according to embodiments of the present disclosure for preparing a polymer article is provided.

According to embodiments of the present disclosure, a method for selective metallization of a surface of a polymer article obtained by a method according to embodiments of the present disclosure for preparing a polymer article is provided. The method may include steps of: providing the polymer article; removing at least a part of the polymer matrix and exposing the metal compound by irradiating the surface of the polymer article with a laser; and forming at least one metal layer on the surface of the polymer article by chemical plating.

According to embodiments of the present disclosure, an ink composition is provided. In some embodiments, the ink composition may contain a binder material and a metal compound obtained by a method according to embodiments of the present disclosure for preparing a metal compound, wherein the metal compound is dispersed in the binder material.

According to embodiments of the present disclosure, a method for selective metallization of a surface of an insulative substrate is provided. The method may include steps of: providing an ink composition according to an embodiment of the present disclosure on the surface of the insulative substrate to form an ink layer, and forming at least one metal layer on the ink layer by chemical plating.

According to some embodiments of the present disclosure, a metal compound obtained by a method according to embodiments of the present disclosure for preparing a metal compound may act as an accelerator for the chemical plating, without reducing the metal compound into pure metal. Thereby, after subjecting a polymer article containing the metal compound to an optional pretreatment, such as selective increase of roughness on the surface of the polymer article performed by irradiating with a laser, selective metallization on the surface of the polymer article may be achieved. In some embodiments, a predetermined area of the surface of the polymer article may be irradiated with a laser, which can cause the metal compound dispersed in the polymer matrix to be exposed. Then at least one metal layer may be formed on the exposed metal compound by chemical plating directly without reducing the metal compound into pure metal. In this way, at least one metal layer may be formed on the predetermined area of the surface of the polymer article.

In some embodiments, selective metallization of the surface of the polymer article may also be performed by applying an ink composition containing the metal compound on the predetermined area of the surface of the polymer article, followed by chemical plating.

According to some embodiments of the present disclosure, when employing the laser to perform the pretreatment, such as increasing the surface roughness, the laser only needs sufficient energy to expose the metal compound in the predetermined areas of the surface of the polymer article. The laser needs not have the amount of energy required to reduce the metal compound into pure metal. After the metal compound is exposed, at least one metal layer may be formed on the predetermined area of the surface of the polymer article by chemical plating, to achieve selective metallization of the surface of the polymer article.

With such an arrangement, the method for selective metallization of a surface of an insulative substrate, such as the polymer article mentioned above, may be implemented with a relatively simple process and requires less energy, yet can achieve high plating speed. Furthermore, the adhesion between the insulative substrate and the metal layers can become stronger.

In some embodiments, the metal compound according to embodiments of the present disclosure has light colors. Therefore, when the metal compound is dispersed in the polymer article, the polymer article can have relative lighter colors as well. Such an arrangement allows creating polymer articles for special applications where polymer articles having lighter colors are required.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
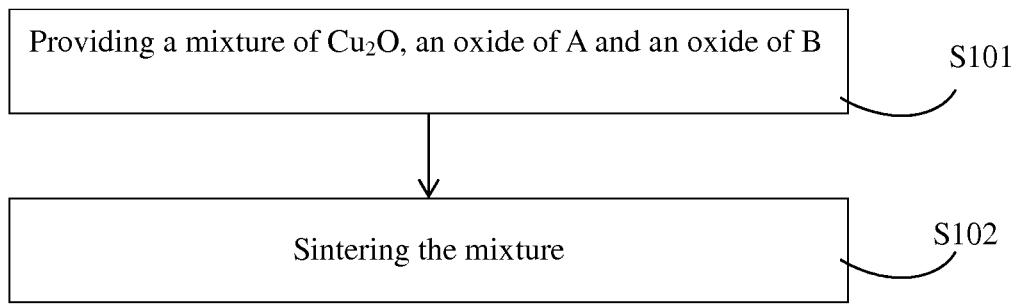
FIG. 1 is a flow chart showing an exemplary method for preparing a metal compound, according to one embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

For the purpose of the present description and of the following claims, the definitions of the numerical ranges always include the extremes unless otherwise specified.

Metal Compound

According to embodiments of a first broad aspect of the present disclosure, a metal compound is provided. The metal compound may have a formula (I):

$$Cu_2A_\alpha B_{2-\alpha}O_{4-\beta} \tag{I}$$

In some embodiments, A may contain at least one element selected from the groups 6 and 8 of the periodic table. In some embodiments, A may contain at least one element selected from a group consisting of Cr, Mo and Fe.

In some embodiments, B may contain at least one element selected from the group 13 of the periodic table. In some embodiments, B may contain at least one element selected from a group consisting of Al, Ga and In.

In some embodiments, $0<\alpha<2$. In some embodiments, $0<\beta<1.5$. In some embodiments, $\alpha$ may be in the range of 0.2-1.5. In some embodiments, $\beta$ may be in the range of 0.1-1.2.

In some embodiments, the metal compound may include, but not limited to, at least one compound selected from a group consisting of: $Cu_2Cr_{0.6}Al_{1.4}O_{3.3}$, $Cu_2FeGaO_{3.9}$, $Cu_2Mo_{1.2}In_{0.8}O_{3.5}$,  $Cu_2Cr_{0.3}Mo_{0.3}Al_{1.4}O_{3.3}$, $Cu_2Cr_{0.6}Ga_{0.7}Al_{0.7}O_{3.3}$, $Cu_2Cr_{0.5}Al_{1.5}O_3$, $Cu_2Cr_{0.8}Ga_{1.2}O_{3.9}$, $Cu_2Mo_{0.5}Al_{1.5}O_3$, $Cu_2Cr_{1.1}Al_{0.9}O_{3.5}$, $Cu_2Fe_{0.5}In_{1.5}O_3$ and $Cu_2Cr_{0.5}Ga_{1.5}O_{2.8}$.

In some embodiments, the metal compound may be used in the form of particles. And the particle size of the metal compound may be selected according to, for example, practical applications for the compound. In some embodiments, the metal compound may have an average particle diameter of about 0.01 μm to about 5 μm. In some embodiments, the metal compound may have an average particle diameter of about 0.04 μm to about 2 μm. The average particle diameter of the metal compounds according to embodiments of the present disclosure may be measured by a conventional method with normally used instruments, such as a laser particle size analyzer.

According to some embodiments of the present disclosure, the metal compound may further contain CuO as an impurity. In some embodiments, the CuO as an impurity in the metal compound may have very low content. In some embodiments, based on the total weight of the metal compound, the content of CuO may be less than about 0.01 mol %. In some embodiments, the content of CuO may be less than about 0.005 mol %. In some embodiments, based on the total weight of the metal compound, the content of CuO may be less than about 0.004 mol %. High content of CuO may cause a polymer to degrade. Therefore, a metal compound having low content of CuO according to embodiments of the present disclosure may lead to less degradation of a polymer (such as the polymer article to be described below). Such an arrangement can make the polymer article more stable and reliable.

Method for Preparing Metal Compound and Metal Compound Prepared by the Same

According to embodiments of the present disclosure, a method for preparing a metal compound is provided. The method may include the steps of: providing a mixture of $Cu_2O$, an oxide of A and an oxide of B with a molar ratio of 100:2-90:3-80, and sintering the mixture under a non-reactive atmosphere. A may contain at least one element selected from the groups 6 and 8 of the periodic table. B may contain at least one element selected from the group 13 of the periodic table.

FIG. 1 is a flow chart showing an exemplary method for preparing a metal compound, according to embodiments of the present disclosure. As shown in FIG. 1, the method for preparing the metal compound includes the following steps:

S101: In some embodiments, a mixture of $Cu_2O$, an oxide of A and an oxide of B is provided. In some embodiments, the $Cu_2O$, the oxide of A and the oxide of B may have a molar ratio of 100:2-90:3-80; and S102: after obtaining the mixture in S101, the mixture may be further sintered under a non-reactive atmosphere, to obtain a metal compound having the formula of $Cu_2A_\alpha B_{2-\alpha}O_{4-\beta}$, wherein the terms A, B, $\alpha$, and $\beta$ have the same meanings as explained above.

In some embodiments, the method may include the following steps: providing the mixture of $Cu_2O$, an oxide of A and an oxide of B with a molar ratio of 100:10-75:5-60, and sintering the mixture under a non-reactive atmosphere.

In some embodiments, A may contain at least one element selected from a group consisting of Cr, Mo and Fe.

In some embodiments, B may contain at least one element selected from a group consisting of Al, Ga and In.

A person with ordinary skill in the art will appreciate that an oxide of A may refer to a compound formed by element A and oxygen, in which A may represent any valence that is normal in A compounds. In some embodiments, A is Cr. In some embodiments, the oxide of A is $Cr_2O_3$. In some embodiments, A is Fe. In some embodiments, the oxide of A is $Fe_2O_3$. In some embodiments, A is Mo. In some embodiments, the oxide of A is $MoO_3$.

A person with ordinary skill in the art will also appreciate that an oxide of B may refer to a compound formed by element B and oxygen, in which B may have any valence that is normal in B compounds.

A person with ordinary skill in the art will appreciate that "a non-reactive atmosphere" typically refers a situation where gases present in the sintering environment is non-reactive or is substantially non-reactive, and "non-reactive gas" typically refers to a gas which rarely reacts with any component of the mixture or with the final metal compound, under normal condition. In some embodiments, the non-reactive gas may be at least one selected from nitrogen and the group 0 gases. In some embodiments, the group 0 gas may be argon.

In some embodiments, the mixture may further contain CuO as a purity. In some embodiments, based on the total weight of the metal compound, the content of the CuO is less than about 0.01 mol %. In some embodiments, the content of the CuO is less than about 0.005 mol %. In some embodiments, the content of the CuO is less than about 0.004 mol %.

In some embodiments, the method may further include a step of grinding powders of $Cu_2O$, an oxide of A and an oxide of B to form compound powders. The grinding may be performed by a method known to those with ordinary skill in the art, which includes but not limited to: drying grinding process, wet grinding process or semi-drying grinding process.

In some embodiments, the grinding may be performed using any conventional instrument, without particular limits.

In some embodiments, the grinding may be performed by a wet grinding process or a semi-drying grinding process. In some embodiments, the grinding is performed by a wet grinding process. With such an arrangement, the prepared metal compound may have a lower CuO content and show a better color.

In some embodiments, the wet grinding process may be performed by using a dispersant. A person with ordinary skill in the art will appreciate that there is no particular limit for the dispersant. In some embodiments, the dispersant may be water.

In some embodiments, the method may further include drying the compound powders to form the mixture. In some embodiments, the dispersant applied during the wet grinding process is removed or is substantially removed in the drying process. In some embodiments, the mixture thus formed contains less than 0.01 mol % of CuO. In some embodiments, the mixture thus formed contains less than 0.005 mol % of CuO. In some embodiments, the mixture thus formed contains less than 0.004 mol % of CuO.

In some embodiments, the drying may be carried out under a non-reactive atmosphere, to avoid oxidation of $Cu_2O$ into CuO when the drying is performed at high temperature, such as at 250° C., which may affect the CuO content and the color of the metal compound. Such an arrangement can prevent the color of the metal compound from becoming too dark.

In some embodiments, the drying may be performed under an oxygen-containing atmosphere at a temperature ranging from about 100° C. to about 200° C. The oxygen-containing atmosphere may include air atmosphere, or an atmosphere formed by oxygen and at least one non-reactive gas with a predetermined ratio between the oxygen and the gas.

In some embodiments, the drying may be performed for a time of about 10 to about 24 hours. In some embodiments, the drying ends when the dispersant in the mixture is removed or substantially removed.

In some embodiments, the drying may be carried out under normal pressure. In some embodiments, the drying may be carried out under a decreased pressure.

There are no specific limits for the temperature of sintering. In some embodiments, the sintering may be performed by any conventional method. In some embodiments, the sintering may be carried out at a temperature ranging from about 500° C. to about 1200° C. In some embodiments, the sintering may be carried out at a temperature ranging from about 800° C. to about 1000° C. There is also no specific limit for the time of sintering, and the time of sintering may be chosen according to practical requirements. In some embodiments, the sintering may be performed for a time ranging from about 1 hour to about 14 hours.

In some embodiments, the method may further include a step of grinding the sintered mixture. In some embodiments, the grinding may give the finally product (e.g. a metal compound prepared by the method) a predetermined range of particle diameter. In some embodiments, the metal compound includes an average particle diameter ranging from about 0.01 μm to about 5 μm. In some embodiments, the metal compound may include an average particle diameter ranging from about 0.04 μm to about 2 μm.

Figure 2:
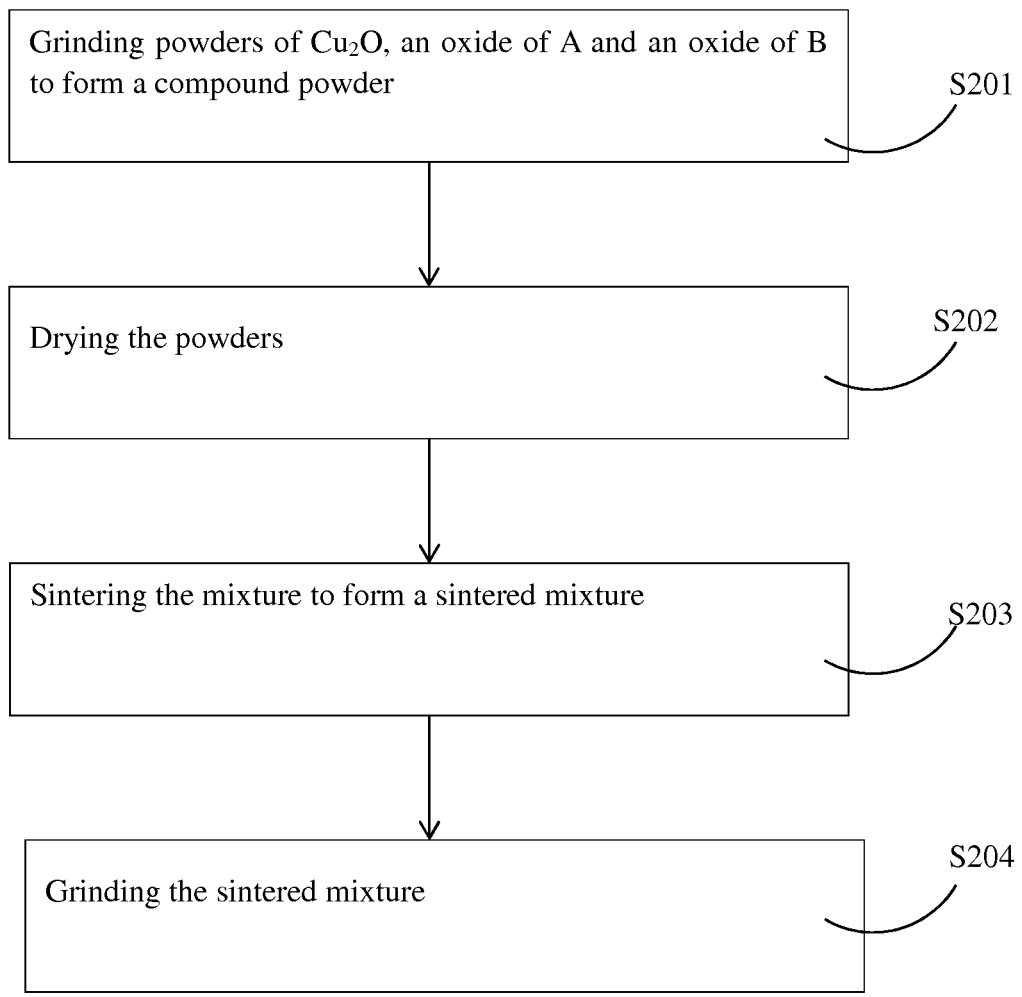
FIG. 2 is a flow chart showing an exemplary method for preparing a metal compound, according to one embodiment of the present disclosure.

FIG. 2 is a flow chart showing an exemplary method for preparing a metal compound, according to one embodiment of the present disclosure. As shown in FIG. 2, the method for preparing the metal compound includes the following steps:

S201: In this step, powders of $Cu_2O$, an oxide of A, and an oxide of B, with a molar ratio of 100:2-90:3-80, are grinded to form compound powders;

S202: After forming the compound powders, the compound powders may be further dried to form the mixture;

S203: In this step, the dried mixture may be sintered under a non-reactive atmosphere to obtain a sintered mixture; and S204: In this step, the sintered mixture may be grinded to obtain the metal compound.

According to embodiments of the present disclosure, the metal compound prepared by said method may be dispersed in a polymer matrix and can be used as chemical plating accelerator directly, without being reduced to pure metal.

According to embodiments of the present disclosure, a metal compound prepared by the above-mentioned method is provided.

Use of Metal Compound

According to embodiments of the present disclosure, use of the above-mentioned metal compound(s) in the selective metallization of a surface of an insulative substrate is provided.

A person with ordinary skill will appreciate that selective metallization of a surface of an insulative substrate may include forming a metal layer on a predetermined area of the surface of the insulative substrate.

In some embodiments, the insulative substrate may contain any insulative material. In some embodiment, the insulative material may include but not is limited to polymers, ceramics, glasses, etc.

In some embodiments, the metallization may be performed by using the above-identified metal compound.

In some embodiments, the metallization includes the following steps. The metal compound may be dispersed into the insulative substrate. Then the surface of the insulative substrate which is to be metallized is subjected to a process of increasing the roughness of the substrate, in which a predetermined area of the insulative substrate may be removed and metal compound in that predetermined area may be exposed. The insulative substrate is then subjected to chemical plating. With such an arrangement, at least one metal layer may be formed on the predetermined area of the surface of the insulative substrate, thereby achieving selective metallization of the surface of the insulative substrate.

In another embodiment, the metallization may include the following steps. The metal compound is included in an ink composition. Then the ink composition is applied on a predetermined area of the surface of the insulative substrate. The insulative substrate is then subjected to chemical plating. With such an arrangement, at least one metal layer may be formed on the predetermined area of the surface of the insulative substrate, thereby achieving selective metallization of the surface of the insulative substrate.

Polymer Article

According to embodiments of the present disclosure, a polymer article is provided. In some embodiments, the polymer article may contain a polymer matrix, and one or more metal compounds according to embodiments of the present disclosure dispersed in the polymer matrix.

In some embodiments, based on the total weight of the polymer article, the content of the metal compounds may range from about 1 wt % to about 30 wt %. In some embodiments, the content of the metal compounds may range from about 5 wt % to about 30 wt %. In some embodiments, the content of the metal compounds may range from about 10 wt % to about 30 wt %. The content of the metal compounds may be chosen based on practical requirement.

The polymer matrix may be any conventional polymer known to those having ordinary skill in the art, and may be chosen according to practical use. In some embodiments, the polymer matrix may be a thermoplastic polymer or a thermosetting polymer. In some embodiments, the polymer matrix may be at least one selected from a group consisting of: plastic, rubber and fiber.

By way of example and without limits, in some embodiments the polymer may be at least one selected from a group consisting of: polyolefin, such as polystyrene, polypropylene, poly(methyl methacrylate), poly(acrylonitrile-butadiene-styrene); polycarbonate; polyester, such as poly(cyclohexyl-paradimethylene terephthalate), poly(diallyl isophthalate), poly(diallyl teraphthalate), poly(butylene naphthalate), poly(ethylene terephthalate), poly(butylene terephthalate); polyamide, such as poly(hexamethylene adipamide), poly(hexamethylene azelamide), poly(hexamethylene succinamide), poly(hexamethylene lauramide), poly(hexamethylene sebacamide), poly(decamethylene sebacamide), poly(undecanoic amide), poly(lauramide), poly(octanamide), poly(9-aminononanoic acid), polycaprolactam, poly(paraphenylene phthalamide), poly(isophenylene phthalamide), poly(paraphenylene adipamide), poly(paraphenylene azelamide); poly(aromatic ether); polyether imide; polycarbonate/(acrylonitrile-butadiene-styrene) alloy; polyphenylene oxide; polyphenylene sulfide; polyimide; polysulfone; poly(ether-ether-ketone); polybenzimidazole; phenol formaldehyde resin; urea formaldehyde resin; melamine-formaldehyde resin; epoxide resin; alkyd resin and polyurethane.

In some embodiments, the polymer article may further contain at least one additive. In some embodiments, the additive can be a filler, an antioxidant, a light stabilizer, etc. By the addition of the additive, the performance and property of the polymer article may be improved. There are no special limits for the content and the type of the additive, and the additive may be selected according to, for example, practical requirements.

The filler used as the additive to the polymer article may be any filler which is non-reactive under the effect of laser (either physically or chemically). In some embodiments, the filler may be at least one selected from: talc, calcium carbonate, glass fiber, tin oxide, carbon black, micro glass bead, calcium sulfate, barium sulfate, titanium dioxide, pearl powder, wollastonite, diatomite, caoline, coal fines, pot clay, mica, oil shale ash, aluminum silicate, alumina, carbon fiber, silica and zinc oxide, where at least the glass fiber is not sensitive to the laser.

In some embodiments, the polymer article may contain glass fiber. With the addition of glass fiber, the thickness of the removed polymer matrix (in other words, the distance from the top surface of the polymer article to the exposed metal compound) may be significantly increased, which may facilitate the deposition of Cu onto the metal compound during the following chemical plating process.

In some embodiments, the polymer article may contain tin oxide, particularly nano tin oxide. With the addition of the nano tin oxide, the energy of laser may be fully utilized as the layer may be used to remove the polymer matrix and to expose the metal compound by the laser.

In some embodiments, the polymer article may contain carbon black. With the addition of the carbon black, the energy absorbed by the polymer matrix may be increased, thus the removed polymer matrix may be increased accordingly.

The antioxidant used as the additive to the polymer article may be any conventional antioxidant in the related art. In some embodiments, the antioxidant may contain a primary antioxidant and a secondary antioxidant. The ratio between the primary antioxidant and the secondary antioxidant may be selected according to, for example, the type of the antioxidant. In some embodiments, the weight ratio between the primary antioxidant and the secondary antioxidant may be about 1:1-4.

In some embodiments, the primary antioxidant may be a hindered phenol antioxidant. By way of example but without limits, in some embodiments, the primary antioxidant may be antioxidant 1098 or antioxidant 1010, in which the antioxidant 1098 mainly contains N,N'-bis-(3-(3,5-di-tert-butyl-4-hydroxyphenyl)propionyl)hexane diamine, and the antioxidant 1010 mainly contains tetra[3-(3,5-di-tert-butyl-4-hydroxyphenyl)propionic acid]pentaerythritol.

In some embodiments, the secondary antioxidant may be a phosphite ester antioxidant. By way of example and without limits, in some embodiments, the secondary antioxidant may be antioxidant 168, which mainly contains tri(2,4-di-tert-butyl-phenyl)phosphorite.

The light stabilizer used as the additive to the polymer article may be of the hindered amine type. In some embodiments, the light stabilizer may be bis(2,2,6,6-tetramethyl-4-piperidyl)sebacate. The light stabilizer may be any known ones in the art, without special limits in the present disclosure.

Method for Preparing Polymer Article and Polymer Article Prepared by the Same

According to embodiments of the present disclosure, a method for preparing a polymer article is provided. The method may include the steps of: providing a mixture containing a polymer matrix according to embodiments of the present disclosure, and a metal compound according to embodiments of the present disclosure, and molding the mixture.

Figure 3:
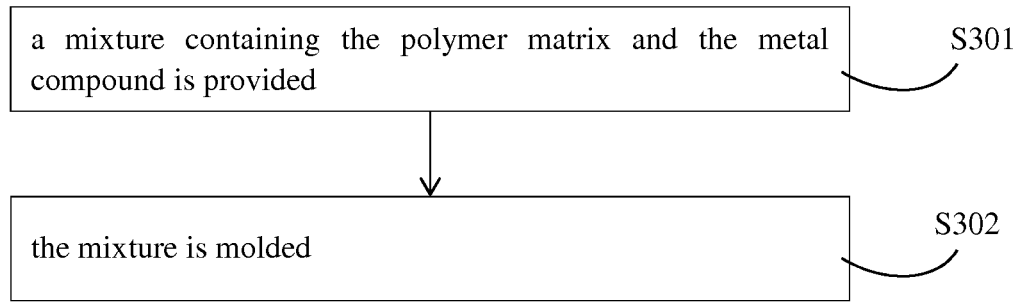
FIG. 3 is a flow chart showing an exemplary method for preparing a polymer article, according to one embodiment of the present disclosure.

FIG. 3 is a flow chart showing an exemplary method for preparing a polymer article, according to one embodiment of the present disclosure. As shown in FIG. 3, in some embodiments, the method for preparing the polymer article includes the following steps:

S301: In this step, a mixture containing the polymer matrix and the metal compound is provided; and S302: After obtaining the mixture, the mixture may be further molded to obtain the polymer article.

In some embodiments, the polymer matrix may further contain a processing agent, for example, a lubricant. With the addition of the processing agent, the processing performance of the polymer matrix may be improved.

In some embodiments, the lubricant may be at least one selected from a group consisting of: ethylene/vinyl acetate copolymer (EVA wax), polyethylene (PE wax) and stearate. With the addition of the lubricant, the flowing performance of the polymer article may be improved.

In some embodiments, the metal compound may have an average particle diameter ranging from about 0.1 µm to about 5 µm. In some embodiments, the metal compound may have an average particle diameter ranging from about 0.4 µm to about 2 µm. The particle size of the metal compound may be selected according to, for example, the molding step, provided that the prepared polymer article is compact.

In some embodiments, based on 100 weight parts of the polymer matrix, the content of the metal compound may range from about 1 weight part to about 40 weight parts. In some embodiments, the content of the metal compound may range from about 5 weight parts to about 30 weight parts. In some embodiments, the content of the metal compound may range from about 10 weight parts to about 30 weight parts. There are no special limits for the content of the metal compound, and the content of the metal compound in the polymer article may be selected according to, for example, practical requirements.

In some embodiments, based on 100 weight parts of the polymer matrix, the content of the filler, used as an addictive to the polymer, may range from about weight part to about 40 weight parts. In some embodiments, the content of the antioxidant, used as an addictive to the polymer, may range from about 0.01 weight part to about 1 weight part. In some embodiments, the content of the light stabilizer, used as an addictive to the polymer, may range from about 0.01 weight part to about 1 weight part. In some embodiments, the content of the lubricant may range from about 0.01 weight part to about 1 weight part. There are no special limits for the content of the additives (for example, antioxidant, lubricant, filler), and the additives may be selected properly based on their properties.

In some embodiments, the molding step may be performed by any conventional molding process known in the art, without special limits in the present disclosure. In some embodiments, the molding step is performed by injection molding. In another embodiment, the molding step is performed by extrusion molding.

According to embodiments of the present disclosure, a polymer article obtained by the aforementioned method is provided.

Method for the Selective Metallization of Surface of Polymer Article

According to embodiments of the present disclosure, a method for selective metallization of a surface of the above-mentioned polymer article(s) is provided. The method may include steps of: providing the polymer article; removing at least a part of the polymer matrix and exposing the metal compound by irradiating the surface of the polymer article with a laser; and forming at least one metal layer on the surface of the polymer article by chemical plating.

Figure 4:
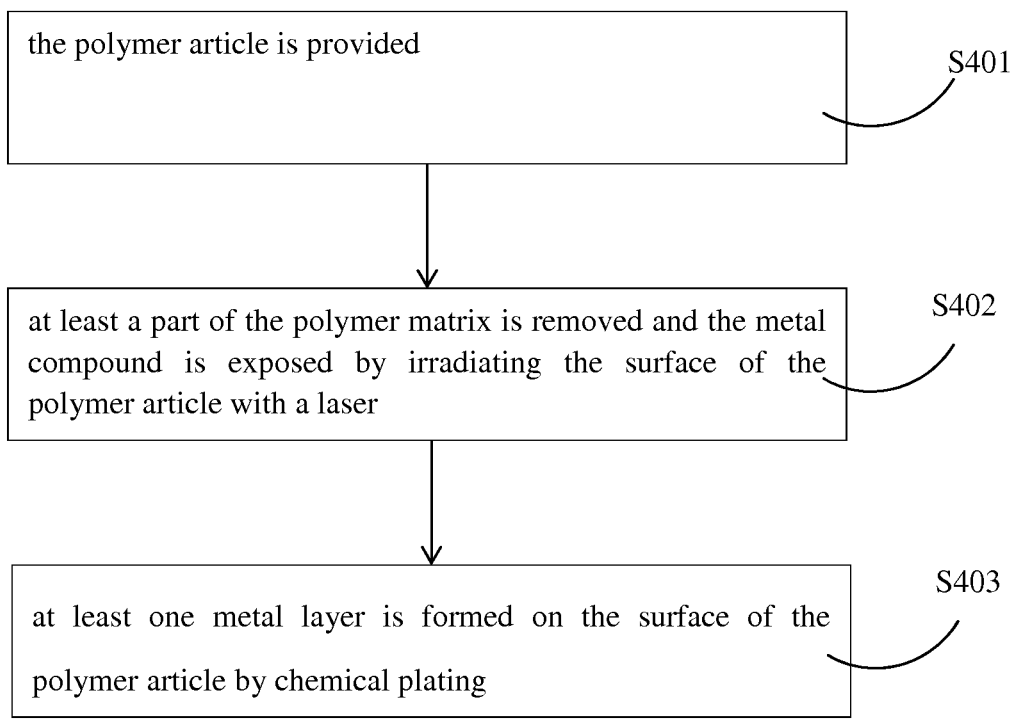
FIG. 4 is a flow chart showing an exemplary method for selective metallization of a surface of a polymer article, according to one embodiment of the present disclosure.

FIG. 4 is a flow chart showing an exemplary method for selective metallization of a surface of a polymer article, according to one embodiment of the present disclosure. As shown in FIG. 4, in some embodiments, the method for selective metallization of the surface of the polymer article may include the following steps:

S401: In this step, a polymer article is provided;

S402: After providing the polymer article, at least a part of the polymer matrix is removed and the metal compound is exposed by irradiating the surface of the polymer article with a laser; and S403: At least one metal layer is formed on the surface of the polymer article by chemical plating.

A person with ordinary skill in the art will appreciate that, when removing at least a part of the polymer matrix and exposing the metal compound, a portion of the polymer matrix in a predetermined area on the surface may be exposed and the metal compound in the predetermined area may also be exposed. As described before, the metal compound according to embodiments of the present disclosure may be used as chemical plating accelerators directly, without being reduced into pure metal, which would have required a large amount of energy. With such an arrangement, when chemical plating is performed on the polymer article, at least one metal layer may be formed on the exposed metal compound, i.e. at least one metal layer may be formed on the predetermined area of the surface of the polymer article. Thus the selective metallization of the surface of the polymer article is achieved.

In some embodiments, the laser may be provided by any conventional technique in the art. In some embodiments, the laser may be provided by a laser instrument. There are no special limits for the condition of irradiating with a laser—the irradiation just needs to be able to remove polymer matrix in the determined area of the surface of the polymer article, and to expose the metal compound in the determined area of the surface of the polymer. The condition of irradiation may be selected according to, for example, the types of the polymer matrix and the laser.

According to embodiments of the present disclosure, when applying the laser to irradiate the surface of the polymer article, the energy of the laser only needs to high enough to expose the metal compound in the determined area of the surface of the polymer article. The energy of the laser needs not be high enough to reduce the metal compound into pure metal. Chemical plating may then be directly performed on the exposed metal compound according to embodiments of the present disclosure. At least one metal layer can then form on the predetermined area of the surface of the polymer article, thereby achieving the selective metallization of the surface of the polymer article. As described above, the method is simple in the process and low in energy requirements.

In some embodiments, the laser may have a wavelength ranging from about 157 nm to about 10.6 μm, a scan speed ranging from about 500 mm/s to about 8000 mm/s, a step ranging from about 3 μm to about 9 μm, a time delay ranging from about 30 μs to about 100 μs, a frequency ranging from about 30 kHz to about 40 kHz, a power ranging from about 3 kW to about 4 kW, and a filling distance ranging from about 10 μm to about 50 μm.

In some embodiments, the metal layer may contain at least one selected from a group consisting of: Cu layer, Ni layer and Au layer.

According to embodiments of the present disclosure, with a laser having the above parameters, the removed polymer matrix may have an average thickness ranging from several microns to dozens of microns. Then the metal compound in the polymer article may be exposed. The polymer article may be formed with a rough surface having uneven microstructures. In the following chemical plating step, metal particles may be deposited in the uneven microstructures. In some embodiments, metal particles can be deposited on the exposed metal compound, thus forming at least one metal layer on the polymer article. With such an arrangement, the adhesion between the metal layer and the polymer article can be very strong.

The chemical plating is well known to persons having ordinary skill in the art. In some embodiments, the chemical plating may be carried out with the following steps. The polymer article subjected to the irradiating is immersed in a Cu solution. In some embodiments, the Cu solution may contain a Cu salt. In some embodiments, the Cu solution may further contain a reducing agent. In some embodiments, the Cu solution may have a pH ranging from about 12 to about 13. In some embodiments, the reducing agent may reduce the Cu ions in the Cu salt into Cu metal. In some embodiments, the reducing agent may be at least one selected from a group consisting of: glyoxylic acid, diamide, and sodium phosphorate.

In some embodiments, the method may further include a step of electroplating or chemical plating. Said electroplating or chemical plating may be performed for at least one time, so that additional metal layers, either of the same metal as or of different metal from the prior metal layers, may be formed on the prior metal layers.

Figure 5:
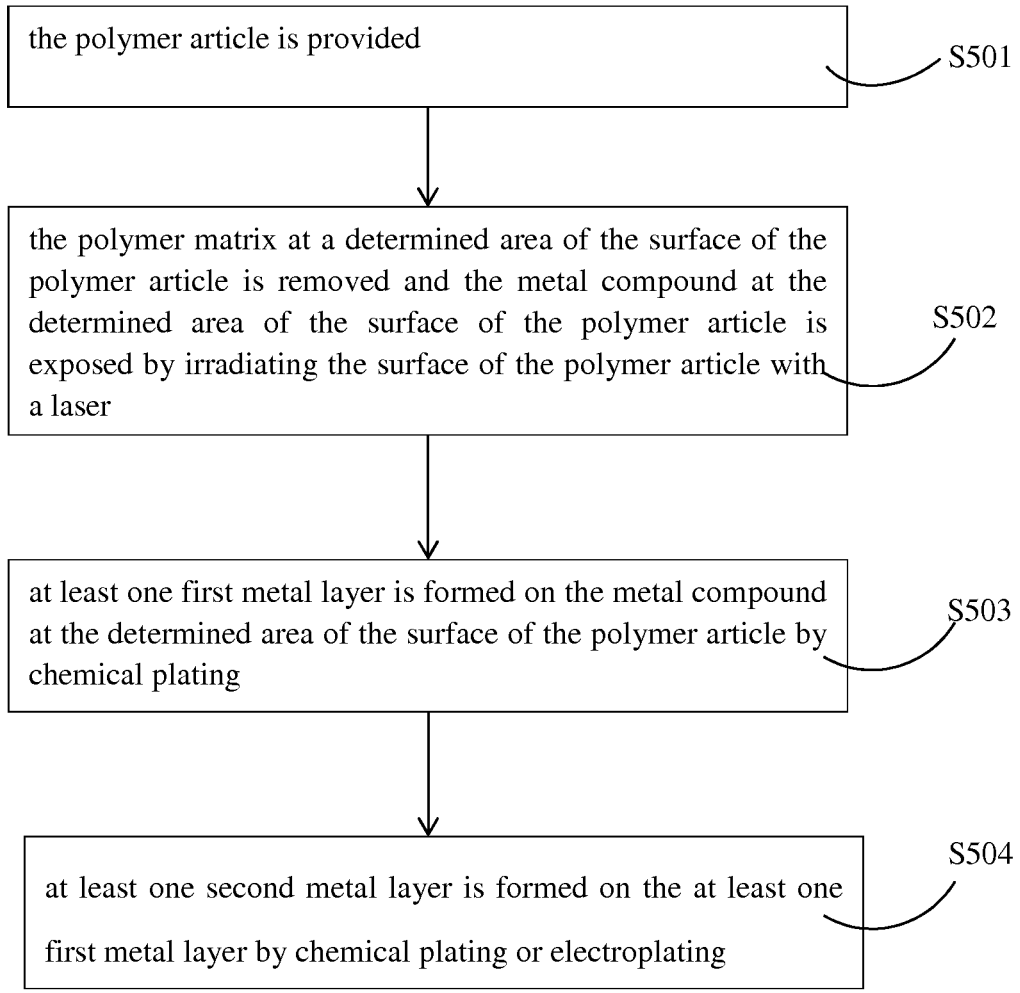
FIG. 5 is a flow chart showing an exemplary method for selective metallization of a surface of a polymer article, according to one embodiment of the present disclosure.

FIG. 5 is a flow chart showing an exemplary method for selective metallization of a surface of a polymer article, according to one embodiment of the present disclosure. In some embodiment, as shown in FIG. 5, the method for selective metallization of the surface of the polymer article may include the following steps:

S501: In this step, a polymer article is provided;

S502: After obtaining the polymer article, the polymer matrix at a determined area of the surface of the polymer article is removed and the metal compound at the determined area of the surface of the polymer article is exposed by irradiating the surface of the polymer article with a laser;

S503: In this step, at least one first metal layer is formed on the metal compound at the determined area of the surface of the polymer article by chemical plating; and S504: In this step, at least one second metal layer is formed on the at least one first metal layer by chemical plating or electroplating.

In some embodiments, the method for the selective metallization of the surface of the polymer article may include steps of: providing the polymer article; removing at least a part of the polymer matrix and exposing the metal compound by irradiating the surface of the polymer article with a laser; forming a Cu layer on the surface of the polymer article by chemical plating using a Cu solution; and forming a Ni layer on the Cu layer by chemical plating using a Ni solution.

Ink Composition

According to embodiments of the present disclosure, an ink composition is provided. In some embodiments, the ink composition may contain a binder material, and a metal compound according to embodiments of the present disclosure dispersed in the binder material.

According to embodiments of the present disclosure, when the ink composition is applied on a surface of an insulative substrate, the binder material may contribute to the uniform dispersion of the metal compound on the surface of the insulative substrate. In some embodiments, with the binder material, an ink layer, which may contain the binder material and the ink composition, may be formed on the surface of the insulative substrate. In some embodiments, the ink layer with the binder material can have certain required strength which allows strong adhesion between the ink layer and the insulative substrate.

There are no specific limits for the binder material, provided the above requirements are satisfied. In some embodiments, the binder material is an organic binder material.

In some embodiments, the binder material may be at least one selected from a group consisting of: cellulose acetate, polyacrylate resin, ethylene-vinyl acetate copolymer, polyvinyl alcohol, polyvinyl acetal, polyvinyl acetate, polyvinyl pyrrolidone, polyphosphonic acid.

There are no specific limits for the binder material in the present disclosure. In some embodiments, a commercially available binder material may be used. In some embodiments, the binder material is at least one selected from a group consisting of: butyl acetate cellulose of CAB series commercially available from Eastman Chemical Company, US, such as butyl acetate cellulose No. CAB381-0.5, butyl acetate cellulose No. CAB381-20, butyl acetate cellulose No. CAB551-0.2 and butyl acetate cellulose No. CAB381-2; and polyvinyl butyral of Mowital series commercially from Kuraray Company, JP, such as polyvinyl butyral No. Mowital B 60T, polyvinyl butyral No. Mowital B 75H and polyvinyl butyral No. Mowital B 60H.

There are no specific limits for the ratio between the binder material and the metal compound in the ink composition. In some embodiments, the metal compound may be dispersed uniformly on the surface of the insulative substrate. In some embodiments, the ink layer has certain amount of strength and certain amount of adhesion with the insulative substrate, wherein at least one metal layer may be formed on the ink layer. In some embodiments, based on 100 weight parts of the metal compound, the content of the binder material may range from about 1 weight part to about 30 weight parts. In some embodiments, the content of the binder material may range from about 15 weight parts to about 30 weight parts.

In some embodiments, the ink composition may further contain a solvent. With the solvent, the metal compound may be dispersed in the binder material more uniformly, and a more uniform ink layer may be formed on the surface of the insulative substrate.

The solvent may be any conventional one known to those with ordinary skill in the art, without specific limits. In some embodiments, the solvent may be at least one selected from a group consisting of: water, $C_1$-$C_{12}$ alcohol, $C_3$-$C_{12}$ ketone, $C_6$-$C_{12}$ aromatic hydrocarbon, $C_1$-$C_{12}$ alkyl halide, and $C_2$-$C_{12}$ alkenyl halide.

In some embodiments, the solvent may be at least one selected from a group consisting of: methanol, ethanol, n-propanol, iso-propanol, n-butanol, tert-butanol, n-pentanol, n-hexanol, n-heptanol, n-octanol, acetone, 2-n-pentanone, 2-n-butanone, 3-methyl-2-pentanone, 2,3-butanedione, 2,3-pentanedione, 2,5-hexanedione, 1,3-cyclohexanedione, toluene, xylene and trichloroethylene.

There are no specific limits for the amount of solvent in the ink composition. In some embodiments, an amount of solvent is added to disperse the metal compound uniformly in the binder material and to form a uniform ink layer on the surface of the insulative substrate. In some embodiments, based on 100 weight parts of the metal compound, the content of the solvent may range from about 20 weight parts to about 200 weight parts. In some embodiments, the content of the solvent may range from about 20 weight parts to about 100 weight parts.

In some embodiments, the ink composition may further contain an additive. The additive may be selected according to, for example, its specific performance or functions. In some embodiments, the additive may be at least one selected from a group consisting of: dispersant, antifoaming agent, leveling agent and viscosity regulator.

The content of the additive may be selected according to, for example, conventional operations. In some embodiments, based on 100 weight parts of the metal compound, the content of the additive may range from about 0.1 weight parts to about 20 weight parts. In some embodiments, the content of the additive may range from about 0.5 weight parts to about 10 weight parts.

According to some embodiments of the present disclosure, with the dispersant, the time which the metal compound costs to disperse uniformly in the binder material and the optional solvent may be reduced, and the stability of the metal compound may be improved. The dispersant may be any substance which is capable of providing the above functions, without specific limits. In some embodiments, the dispersant may be an organic dispersant.

In some embodiments, the organic dispersant may be at least one selected from a group consisting of: aliphatic amine, hydramine, unsaturated cycloamine, fatty acid, polymers such as polyacrylate or polyester, and organic phosphines.

In some embodiments, the dispersant may be any conventional one that is commercially available. In some embodiments, the dispersant may be at least one selected from a group consisting of: dispersants with the following Nos. commercially available from BYK company in Germany (GE): ANTI-TERRA-U, ANTI-TERRA-U 80, ANTI-TERRA-U 100, DISPERBYK-101, DISPERBYK-130, BYK-220 S, LACTIMON, LACTIMON-WS, BYK-W 966, DISPERBYK, BYK-154, BYK-9076, DISPERBYK-108, DISPERBYK-109, DISPERBYK-110, DISPERBYK-102, DISPERBYK-111, DISPERBYK-180, DISPERBYK-106, DISPERBYK-187, DISPERBYK-181, DISPERBYK-140, DISPERBYK-142, DISPERBYK-145, DISPERBYK-115, DISPERBYK-160, DISPERBYK-161, DISPERBYK-162, DISPERBYK-163, DISPERBYK-164, DISPERBYK-165, DISPERBYK-166, DISPERBYK-167, DISPERBYK-182, DISPERBYK-183, DISPERBYK-184, DISPERBYK-185, DISPERBYK-168, DISPERBYK-169, DISPERBYK-170, DISPERBYK-171, DISPERBYK-174, DISPERBYK-190, DISPERBYK-2150, BYK-9077, DISPERBYK-112, DISPERBYK-116, DISPERBYK-191, DISPERBYK-192, DISPERBYK-2000, DISPERBYK-2001, DISPERBYK-2010, DISPERBYK-2020, DISPERBYK-2025, DISPERBYK-2050 and DISPERBYK-2070; dispersant No. PHOSPHOLAN PS-236 commercially available from Akzo Nobel Company, DL; dispersant No. PS-21A commercially available from Witco Chemical Company, US; and dispersants Serial Nos. Hypermer KD and Zephrym PD commercially available from Croda Company, GB.

The content of the dispersant may be determined based on normal operation without specific limits. In some embodiments, based on 100 weight parts of the metal compound, the content of the dispersant may range from about 0.1 weight parts to about 4 weight parts.

The antifoaming agent may be any conventional one capable of preventing the formation of foams, destroying the formed foams or removing the formed foams from the ink composition. In some embodiments, the antifoaming agent may be at least one selected from a group consisting of: organic polysiloxane, polyether and fatty alcohol. In some embodiments, the antifoaming agent is of the organic polysiloxane series.

The antifoaming agent may be any conventional one which is commercially available. In some embodiments, the antifoaming agent may be at least one selected from a group consisting of: antifoaming agents having the following Nos. commercially available from BYK Company, GE: BYK-051, BYK-052, BYK-053, BYK-055, BYK-057, BYK-020, BYK-065, BYK-066N, BYK-067A, BYK-070, BYK-080A, BYK-088, BYK-141, BYK-019, BYK-021, BYK-022, BYK-023, BYK-024, BYK-025, BYK-028, BYK-011, BYK-031, BYK-032, BYK-033, BYK-034, BYK-035, BYK-036, BYK-037, BYK-038, BYK-045, BYK-A530, BYK-A555, BYK-071, BYK-060, BYK-018, BYK-044 and BYK-094.

The amount of the antifoaming agent in the ink composition is known to a person having ordinary skill in the related art, without specific limits. In some embodiments, based on 100 weight parts of the metal compound, the amount of the antifoaming agent may range from about 0.01 weight parts to about 3 weight parts.

According to embodiments of the present disclosure, with the addition of a leveling agent, the ink layer formed on the surface of the insulative substrate can be more flat and become smoother. There are no specific limits for the leveling agent in the present disclosure, and the leveling agent may be conventional ones which are capable of realizing the above functions. In some embodiments, the leveling agent may be at least one selected from a group consisting of: polyacrylate series, polydimethylsiloxane series, polymethylphenylsiloxane series and fluorine-containing surfactant.

The leveling agent may be any conventional one which is commercially available. In some embodiments, the leveling agent may be at least one selected from a group consisting of: leveling agents having the following Nos. commercially available from BYK Company, GE: BYK-333, BYK-306, BYK-358N, BYK-310, BYK-354 and BYK-356.

The amount of the leveling agent in the ink composition is known to a person having ordinary skill in the related art, without specific limits. In some embodiments, based on 100 weight parts of the metal compound, the amount of the leveling agent may range from about 0.3 weight parts to about 4 weight parts.

According to embodiments of the present disclosure, with the addition of a viscosity regulator, the viscosity of the ink composition may be adjusted, depending on the practical requirements. There are no specific limits for the viscosity regulator in the present disclosure, and the viscosity regulator may be conventional ones. In some embodiments, the viscosity regulator may be at least one selected from a group consisting of: gaseous silica, polyamide wax, organic bentonite, hydrogenated castor oil, metallic soap, hydroxyl alkyl cellulose and derivatives thereof; polyvinyl alcohol and polyacrylate.

The amount of the viscosity regulator in the ink composition is well known to a person having ordinary skill in the related art, without specific limits. In some embodiments, based on 100 weight parts of the metal compound, the amount of the viscosity regulator may range from about 0.3 weight parts to about 3 weight parts.

In some embodiments, the ink composition contains, or alternatively consists of, the metal compound, the binder material, the solvent, the dispersant, the antifoaming agent, the leveling agent and the viscosity regulator. Based on 100 weight parts of the metal compound, the amount of the binder material ranges from about 1 weight part to about 30 weight parts. In some embodiments, the amount of the solvent ranges from about 20 weight parts to about 200 weight parts. In some embodiments, the amount of the dispersant ranges from about 0.4 weight parts to about 4 weight parts. In some embodiments, the amount of the antifoaming agent ranges from about 0.1 weight part to about 3 weight parts. In some embodiments, the amount of the leveling agent ranges from about 0.3 weight parts to about 4 weight parts. In some embodiments, the amount of the viscosity regulator ranges from about 0.3 weight parts to about 3 weight parts.

There are no specific limits for the preparing method of the ink composition in the present disclosure, provided the metal compound, the binder material and the optional additive are mixed uniformly. In some embodiments, the method for preparing the ink composition includes the following steps. The metal compound, the binder material and the optional solvent and additive are mixed to form a first mixture. Then the first mixture is grinded in a mixer which can be, for example, a planetary ball mill, to obtain the ink composition. Mixing and grinding in the planetary ball mill, as well as operation steps and conditions for the mixing and grinding, are well known to a person having ordinary skill in the art, thus details thereof are omitted.

According to embodiments of the present disclosure, by applying the ink composition on the surface of the insulative substrate, which can be non-conductive to, for example, electricity, and followed by chemical plating on the insulative substrate, selective metallization of the surface of the insulative substrate may be achieved. In some embodiments, when applying the ink composition on the surface of the insulative substrate to form the ink layer, the metal compound is dispersed in a predetermined area of the ink layer, or on a predetermined area of the surface of the insulative substrate. Then with the following chemical plating, metals may be deposited on the predetermined area of the insulative substrate, thereby at least one metal layer may be formed on the predetermined area of the insulative substrate. In this way, the selective metallization of the surface of the insulative substrate can be achieved. In some embodiments, the predetermined area is designated to be consistent with the signal conduction requirements. In some embodiments, a signal conduction passage path may be formed in the insulative substrate.

Method for Selective Metallization of Surface of Insulative Substrate

According to embodiments of a tenth broad aspect of the present disclosure, a method for the selective metallization of a surface of an insulative substrate is provided. The method may include steps of: providing the above-mentioned ink composition on the surface of the insulative substrate to form an ink layer, and forming at least one metal layer on the ink layer by chemical plating.

Figure 6:
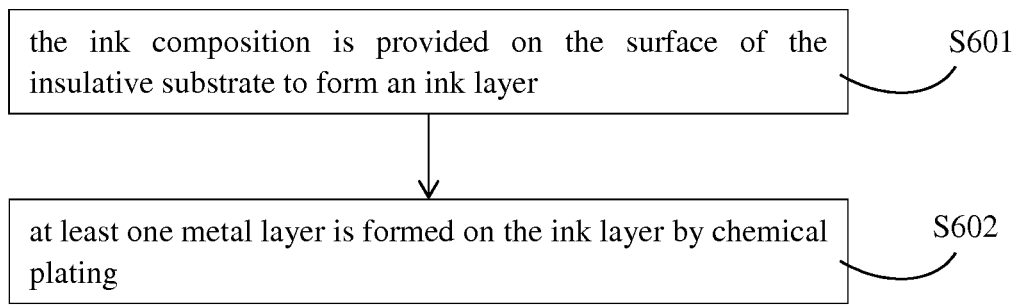
FIG. 6 is a flow chart showing an exemplary method for selective metallization of a surface of an insulative substrate, according to one embodiment of the present disclosure.

FIG. 6 is a flow chart showing an exemplary method for selective metallization of a surface of an insulative substrate, according to one embodiment of the present disclosure. In some embodiments, as shown in FIG. 6, the method for selective metallization of a surface of an insulative substrate may include the following steps:

S601: In this step, an ink composition is provided on the surface of the insulative substrate to form an ink layer; and S602: After forming the ink layer, at least one metal layer is formed on the ink layer by chemical plating.

According to embodiments of the present disclosure, the ink composition may be applied on a determined area of the surface of the insulative substrate, while the remaining of the surface of the insulative substrate is not covered with the ink composition. Therefore, the ink layer is only formed in the determined area of the surface of the insulative substrate. As the ink layer containing the metal compound is conductive, by performing the chemical plating on the insulative substrate, at least one metal layer may be formed on portion of the ink layer, for example, on the determined area of the surface of the insulative substrate, and the metal layer may not be deposited on the remaining area of the surface of the substrate. In this way, selective metallization of the surface of the insulative substrate can be achieved.

Various commonly used processes may be used for providing the ink composition according to embodiments of the present disclosure on the insulative substrate, for example, a process selected from a group consisting of: screen printing, spray coating, laser printing, ink jet printing, pad printing, gravure printing, letterpress printing, and lithographic printing, can be used. In some embodiments, the ink composition is applied on the surface of the insulative substrate by ink jet printing or laser printing. Specific operating steps and conditions of screen printing, spray coating, laser printing, ink jet printing, pad printing, gravure printing, letterpress printing, and lithographic printing are well known to a person with ordinary skill in the art, so a detailed description thereof will be omitted here for the clarity purpose.

In some embodiments, the method may further include a step of drying the ink layer.

The drying is well known to a person having ordinary skill in the art, without specific limits, and the drying may be selected based on the binder material and the optional solvent in the ink composition. In some embodiments, the drying may be carried out at a temperature ranging from about 40° C. to about 150° C. In some embodiments, the drying can be carried out for a time ranging from about 0.5 hours to about 5 hours. In some embodiments, the drying may be performed under normal pressure. In some embodiments, the drying may be performed under a decreased pressure.

There are no specific limits for the thickness of the ink layer in the present disclosure, provided that the following chemical plating is capable of perform the selective metallization on the surface of the insulative substrate. In some embodiments, the ink layer has a thickness ranging from about 12 μm to about 40 μm. In some embodiments the ink layer has a thickness ranging from about 12 μm to about 25 μm.

In some embodiments, the method may further include a step of forming at least one additional metal layer after the chemical plating. According to embodiments of the present disclosure, the ink layer contains the metal compound and is conductive, thus chemical plating can be performed directly on the ink layer to form at least one metal layer on the ink layer.

The chemical plating is well known to a person having ordinary skill in the art, without specific limits. Thus details related to the chemical plating are omitted herein.

In some embodiments, the chemical plating may be performed for at least one time, so that at least one metal layer may be formed on the surface of the substrate. The component and the thickness of the at least one metal layer may be selected according to, for example, practical requirements. In some embodiments, at least two metal layers are formed on the surface of the insulative substrate. The metal layers may be formed by the same metal, or alternatively, the metal layers may be formed by different metals.

In some embodiments, the insulative substrate may contain at least one selected from a group consisting of: plastic, rubber, fiber, coating layer, ceramic, glass, wood, cement and paper. In some embodiments, the insulative substrate may be made by plastic or ceramic.

In some embodiments, the insulative substrate is made of flexible plastic, which may include but not limited to: polyethylene terephthalate, polyimide, polycarbonate, poly (ether-ketone), poly(ether-ether-ketone) and liquid crystal. When applying the flexible plastic on the surface of the insulative substrate and performing the chemical plating, the at least one metal layer formed on the insulative substrate can be used for various applications, such as preparing flexible circuits.

Figure 7:
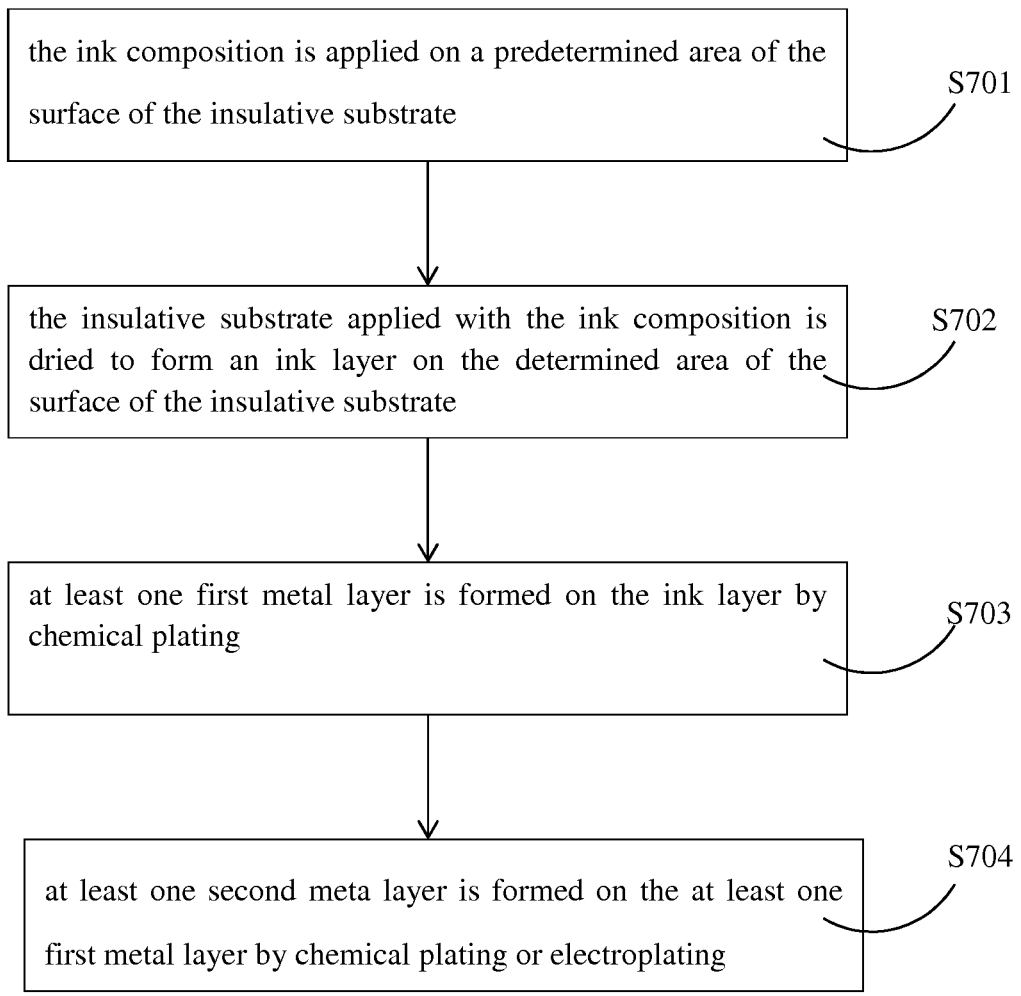
FIG. 7 is a flow chart showing an exemplary method for selective metallization of a surface of an insulative substrate, according to one embodiment of the present disclosure.

FIG. 7 is a flow chart showing an exemplary method for selective metallization of a surface of an insulative substrate, according to one embodiment of the present disclosure. In some embodiments, as shown in FIG. 7, the method for selective metallization of a surface of an insulative substrate may include the following steps:

S701: In this step, an ink composition is applied on a predetermined area of the surface of the insulative substrate;

S702: In this step, the insulative substrate applied with the ink composition is dried to form an ink layer on the determined area of the surface of the insulative substrate;

S703: In this step, at least one first metal layer is formed on the ink layer by chemical plating; and S704: In this step, at least one second metal layer is formed on the at least one first metal layer by chemical plating or electroplating.

It will be understood that the features mentioned above and those still to be explained hereinafter may be used not only in the particular combination specified but also in other combinations or on their own, without departing from the scope of the present invention.

Some illustrative and non-limiting examples are provided hereunder for a better understanding of the present invention and for its practical embodiment.

Testing Method

Samples of the metal compounds and the polymer articles obtained from the following Examples and Comparative Examples were subjected to the following tests.

Composition

In the following Examples and Comparative Examples, the composition of the metal compound was measured by an Inductively Coupled Plasma-Atomic Emission Spectrometry (ICP-AES). The results were recorded in Table 1.

Content of CuO

In the following Examples and Comparative Examples, the content of CuO were both measured by an Inductively Coupled Plasma-Atomic Emission Spectrometry (ICP-AES). The content of CuO was based on the total weight of the metal compound. The results were recorded in Table 1.

Particle Diameter (PD)

In the following Examples and Comparative Examples, the particle diameter (i.e. average volume diameter) of the metal compound was measured by a Laser Particle Sizer commercially available from Chengdu Jingxin Powder Analyse Instrument Co., Ltd., China. The results are shown in Table 1.

Adhesion

In the following Examples and Comparative Examples, the adhesion between the metal layer and the insulative substrate was determined by a cross-cut process. Specifically, a surface of the sample to be measured was cut using a cross-cut knife to form 100 1 mm×1 mm grids. A gap between adjacent grids was formed to reach the bottom of the metal layer. Debris in the test region was cleaned using a brush, and then an adhesive tape (3M600 gummed paper) was sticked to a tested grid. One end of the gummed paper was rapidly torn off in a vertical direction. Two identical tests were performed on the same grid region. The grade of the adhesion was determined according to the following standard:

ISO grade 0: the cut edge is smooth and the metal layers both at the cut edge and cut intersection of the grid does not fall off;

ISO grade 1: the metal layers at the cut intersection are partly removed, but no more than 5% (area percent) of the metal layers are removed;

ISO grade 2: the metal layers at the cut edge and the cut intersection are partly removed, and 5-15% (area percent) of the metal layers are removed;

ISO grade 3: the metal layers at the cut edge and the cut intersection are partly removed, and 15-35% (area percent) of the metal layers are removed;

ISO grade 4: the metal layers at the cut edge and the cut intersection are partly removed, and 35-65% (area percent) of the metal layers are removed;

ISO grade 5: the metal layers at the cut edge and the cut intersection are partly removed, and more than 65% (area percent) of the metal layers are removed.

The results are shown in Table 1.

Degradability

In the following Examples and Comparative Examples, the Melt Flow Rates (MFRs) of the raw material, the polymer article containing the metal compound and the polymer article formed with the metal layer were determined at a temperature of 300° C. and under a load of 11.76N.

The degradability of the polymer article was calculated according to the following equation:

$$D=(MI^0-MI^1)/MI^0,$$

$MI^0$ is the MFR of the raw material (in g/min), and $MI^1$ is the MFR of the polymer article containing the metal compound or the polymer article formed with the metal layer (in g/min). The degradability of the polymer particle (De. 1) and the degradability of the polymer article formed with the metal layer (De. 2) were calculated. The results are shown in Table 1.

Color

In the following Examples and Comparative Examples, the metal compound was observed and the color, the hex color code and the RGB color mode of the metal compound were recorded. The results were shown in Table 1.

EXAMPLES

Example 1 (E1)

The present example included the following steps:

1) Preparation of the Metal Compound $Cu_2O$, $Cr_2O_3$ and $Al_2O_3$ having a molar ratio of 1:0.3:0.7 were mixed to form a first mixture. Then the first mixture was subjected to a wet grinding process using water as the dispersant, in which based on 100 weight parts of the first mixture, the content of the water was 150 weight parts. The wet grinding process was performed under a rotation speed of 500 rpm for 5 hours. Thus compound powders were obtained.

The compound powders were dried in a drying oven, under the air atmosphere at a temperature of 100° C. for 12 hours, thus obtaining drying powders.

The drying powders were sintered in a muffle furnace, under a temperature of 800° C. for 2 hours, and then were subjected to a drying grinding process to obtain a metal compound.

The average particle diameter of the metal compound was measured according to the above-identified test, and the metal compound was proved to have an average particle diameter of 2 μm.

The composition of the metal compound was measured according to the above-identified test, and the metal compound was proved to have the formula of $Cu_2Cr_{0.6}Al_{1.4}O_{3.3}$.

The content of CuO in the metal compound was measured according to the above-identified test, and the content of CuO was proved to be 0.0027 mol %.

It was observed that the metal compound was light blue, and has a hex color code of #87CEFA, and a RGB color mode of 135, 206, 250.

2) Preparation of the Polymer Article

Polycarbonate, antioxidant 1098, stabilizer polyethylene (PE) wax and the metal compound obtained from the step 1) were mixed and granulated to form particles, in which based on 100 weight parts of the polycarbonate, the metal compound was 40 weight parts, the antioxidant was 0.05 weight parts and the stabilizer was 0.04 weight parts. The particles were injection molded in an injection molding machine, thus obtaining a polymer article (sheet) having a thickness of 2 mm.

It was observed that the polymer article was light blue, and has a hex color code of #87CEFA, and a RGB color mode of 135, 206, 250.

3) Forming the Metal Layer on the Polymer Article

A surface of the polymer article obtained from the step 2) was irradiated with a YLP-20 laser (commercially available from Hans Laser Company, China) under a condition of: a wavelength of 1064 nm, a scan speed of 1000 mm/s, a step of 6 μm, a time delay of 50 μs, a frequency of 30 kHz, a power of 4 kW and a filling distance of 20 μm. The movements of the laser beam and the polymer article were controlled with a computer program. Then the irradiated polymer article was cleaned and was subjected to chemical plating using a Cu solution containing: 5 g/L of $CuSO_4.5H_2O$, 25 g/L of potassium sodium tartrate, 7 g/L of NaOH, 10 g/L of formaldehyde and 0.1 g/L of a stabilizer. A metal layer (Cu layer) having a thickness of 2 μm was formed on the polymer article.

The plating speed was 5 μm/h.

The adhesion between the polymer article and the metal layer was measured according to the above-identified test, and the adhesion was proved to be ISO grade 1.

The degradability of the polymer articles obtained from steps 2) and 3) (i.e. the degradability of the polymer article (De. 1) and the degradability of the polymer article formed with the metal layer (De. 2)) was measured according to the above-identified test, respectively, and the degradabilities were proved to be 20.01% and 20.11% respectively.

Comparative Example 1 (CE1)

The Comparative Example 1 was performed substantially the same as the Example 1, with the following differences.

In the step 1), CuO was employed instead of $Cu_2O$.

The composition of the metal compound was measured according to the above-identified test, and the metal compound was proved to have the formula of $CuCrAlO_4$.

The content of CuO in the metal compound was measured according to the above-identified test, and the content of CuO was proved to be 0.008 mol %.

It was observed that the metal compound was black, and has a hex color code of #000000, and a RGB color mode of 0, 0, 0.

In the step 2), the metal compound from the present step 1) was employed instead of the metal compound of Example 1.

It was observed that the polymer article was black, and has a hex color code of #000000, and a RGB color mode of 0, 0, 0.

In the step 3), the polymer article from the present step 2) was employed instead of the polymer article of Example 1.

The plating speed was 2 µm/h.

The adhesion between the polymer article and the metal layer was measured according to the above-identified test, and the adhesion was proved to be ISO grade 4.

The degradability of the polymer articles obtained from steps 2) and 3) was measured according to the above-identified test, respectively, and the degradability was proved to be 34.12% and 35.11% respectively.

Comparative Example 2 (CE2)

The Comparative Example 2 was performed substantially the same as the Example 1, with the following differences.

In the step 1), the sintering was carried out in the air atmosphere.

The composition of the metal compound was measured according to the above-identified test, and the metal compound was proved to have the formula of $CuCr_{0.3}Al_{0.7}O_4$.

The content of CuO in the metal compound was measured according to the above-identified test, and the content of CuO was proved to be 0.1075 mol %.

It was observed that the metal compound was black, and has a hex color code of #000000, and a RGB color mode of 0, 0, 0.

In the step 2), the metal compound from the present step 1) was employed instead of the metal compound of Example 1.

It was observed that the polymer article was black, and has a hex color code of #000000, and a RGB color mode of 0, 0, 0.

In the step 3), the polymer article from the present step 2) was employed instead of the polymer article of Example 1.

The plating speed was 2 µm/h.

The adhesion between the polymer article and the metal layer was measured according to the above-identified test, and the adhesion was proved to be ISO grade 4.

The degradability of the polymer articles obtained from steps 2) and 3) was measured according to the above-identified test, respectively, and the degradability was proved to be 70.12% and 73.11% respectively.

Comparative Example 3 (CE3)

The Comparative Example 3 was performed substantially the same as the Example 1, with the following differences.

In the step 1), ZnO was employed instead of $Cr_2O_3$.

The composition of the metal compound was measured according to the above-identified test, and the metal compound was proved to have the formula of $Cu_2ZnAlO_{3.5}$.

The content of CuO in the metal compound was measured according to the above-identified test, and the content of CuO was proved to be 0.0055 mol %.

It was observed that the metal compound was dark green, and has a hex color code of #006400, and a RGB color mode of 0, 100, 0.

In the step 2), the metal compound from the present step 1) was employed instead of the metal compound of Example 1.

It was observed that the polymer article was dark green, and has a hex color code of #006400, and a RGB color mode of 0, 100, 0.

In the step 3), the polymer article from the present step 2) was employed instead of the polymer article of Example 1.

The plating speed was 4 µm/h.

The adhesion between the polymer article and the metal layer was measured according to the above-identified test, and the adhesion was proved to be ISO grade 3.

The degradability of the polymer articles obtained from steps 2) and 3) was measured according to the above-identified test, respectively, and the degradability was proved to be 33.02% and 33.15% respectively.

Comparative Example 4 (CE4)

The Comparative Example 4 was performed substantially the same as the Example 1, with the following differences.

In the step 1), $SiO_2$ was employed instead of $Al_2O_3$.

The composition of the metal compound was measured according to the above-identified test, and the metal compound was proved to have the formula of $Cu_2Cr_{0.4}Si_{1.6}O_4$.

The content of CuO in the metal compound was measured according to the above-identified test, and the content of CuO was proved to be 0.0073 mol %.

It was observed that the metal compound was dark brown, and has a hex color code of #800000, and a RGB color mode of 128, 0, 0.

In the step 2), the metal compound from the present step 1) was employed instead of the metal compound of Example 1.

It was observed that the polymer article was dark brown, and has a hex color code of #800000, and a RGB color mode of 128, 0, 0.

In the step 3), the polymer article from the present step 2) was employed instead of the polymer article of Example 1.

The plating speed was 1 µm/h.

The adhesion between the polymer article and the metal layer was measured according to the above-identified test, and the adhesion was proved to be ISO grade 3.

The degradability of the polymer articles obtained from steps 2) and 3) was measured according to the above-identified test, respectively, and the degradability was proved to be 44.35% and 45.25% respectively.

Comparative Example 5 (CE5)

The Comparative Example 5 was performed substantially the same as the Example 1, with the following differences.

In the step 1), $Al_2O_3$ was not used.

The composition of the metal compound was measured according to the above-identified test, and the metal compound was proved to have the formula of $CuCrO_2$.

The content of CuO in the metal compound was measured according to the above-identified test, and the content of CuO was proved to be 0.0035 mol %.

It was observed that the metal compound was dark green, and has a hex color code of #006400, and a RGB color mode of 0, 100, 0.

In the step 2), the metal compound from the present step 1) was employed instead of the metal compound of Example 1.

It was observed that the polymer article was dark green, and has a hex color code of #006400, and a RGB color mode of 0, 100, 0.

In the step 3), the polymer article from the present step 2) was employed instead of the polymer article of Example 1.

The plating speed was 4 µm/h.

The adhesion between the polymer article and the metal layer was measured according to the above-identified test, and the adhesion was proved to be ISO grade 2.

The degradability of the polymer articles obtained from steps 2) and 3) was measured according to the above-identified test, respectively, and the degradability was proved to be 25.68% and 26.35% respectively.

Comparative Example 6 (CE6)

The Comparative Example 6 was performed substantially the same as the Example 1, with the following differences.

In the step 1), the compound powders were dried in a drying oven, under the air atmosphere at a temperature of 250° C. for 6 hours.

The composition of the metal compound was measured according to the above-identified test, and the metal compound was proved to have the formula of $CuCrAlO_4$.

The content of CuO in the metal compound was measured according to the above-identified test, and the content of CuO was proved to be 0.0075 mol %.

It was observed that the metal compound was black, and has a hex color code of #000000, and a RGB color mode of 0, 0, 0.

In the step 2), the metal compound from the present step 1) was employed instead of the metal compound of Example 1.

It was observed that the polymer article was black, and has a hex color code of #000000, and a RGB color mode of 0, 0, 0.

In the step 3), the polymer article from the present step 2) was employed instead of the polymer article of Example 1.

The plating speed was 2 μm/h.

The adhesion between the polymer article and the metal layer was measured according to the above-identified test, and the adhesion was proved to be ISO grade 4.

The degradability of the polymer articles obtained from steps 2) and 3) was measured according to the above-identified test, respectively, and the degradability was proved to be 37.25% and 37.55% respectively.

Example 2 (E2)

The present example included the following steps:
1) Preparation of the Metal Compound $Cu_2O$, $Fe_2O_3$ and $Ga_2O_3$ having a molar ratio of 1:0.5:0.5 were mixed to form a first mixture. Then the first mixture was subjected to a wet grinding process using water as the dispersant, in which based on 100 weight parts of the first mixture, the content of the water was 180 weight parts. The wet grinding process was performed under a rotation speed of 1500 rpm for 3 hours. Thus compound powders were obtained.

The compound powders were drying in a drying oven, under the nitrogen atmosphere at a temperature of 200° C. for 10 hours, thus obtaining drying powders.

The drying powders were sintered in a muffle furnace, under a temperature of 950° C. for 6 hours, and then were subjected to a drying grinding process to obtain a metal compound.

The average particle diameter of the metal compound was measured according to the above-identified test, and the metal compound was proved to have an average particle diameter of 1.5 μm.

The composition of the metal compound was measured according to the above-identified test, and the metal compound was proved to have the formula of $Cu_2FeGaO_{3.9}$.

The content of CuO in the metal compound was measured according to the above-identified test, and the content of CuO was proved to be 0.0015 mol %.

It was observed that the metal compound was light green, and has a hex color code of #90EE90, and a RGB color mode of 144, 238, 144.

2) Preparation of the Polymer Article

Polycarbonate, antioxidant 1098, stabilizer polyethylene (PE) wax and the metal compound obtained from the step 1) were mixed and granulated to form particles, in which based on 100 weight parts of the polycarbonate, the metal compound was 40 weight parts, the antioxidant was 0.8 weight parts and the stabilizer was 0.3 weight parts. The particles were injection molded in an injection molding machine, thus obtaining a polymer article (sheet) having a thickness of 2 mm.

It was observed that the polymer article was light green, and has a hex color code of #90EE90, and a RGB color mode of 144, 238, 144.

3) Forming the Metal Layer on the Polymer Article

A surface of the polymer article obtained from the step 2) was irradiated with a YLP-20 laser (commercially available from Hans Laser Company, China) under a condition of: a wavelength of 1064 nm, a scan speed of 1000 mm/s, a step of 4 μm, a time delay of 50 μs, a frequency of 30 kHz, a power of 3 kW and a filling distance of 15 μm. The movements of the laser beam and the polymer article were controlled with a computer program. Then the irradiated polymer article was cleaned and was subjected to chemical plating using a Cu solution containing: 5 g/L of $CuSO_4.5H_2O$, 25 g/L of potassium sodium tartrate, 7 g/L of NaOH, 10 g/L of formaldehyde and 0.1 g/L of a stabilizer. A metal layer (Cu layer) having a thickness of 2 μm was formed on the polymer article.

The plating speed was 5 μm/h.

The adhesion between the polymer article and the metal layer was measured according to the above-identified test, and the adhesion was proved to be ISO grade 1.

The degradabilities of the polymer articles obtained from steps 2) and 3) were measured according to the above-identified test, respectively, and the degradabilities were proved to be 19.02% and 19.52%.

Example 3 (E3)

The present example included the following steps.
1) Preparation of the Metal Compound $Cu_2O$, $Mo_2O_3$ and $In_2O_3$ having a molar ratio of 1:0.6:0.4 were mixed to form a first mixture. Then the first mixture was subjected to a wet grinding process using water as the dispersant, in which based on 100 weight parts of the first mixture, the content of the water was 120 weight parts. The wet grinding process was performed under a rotation speed of 1500 rpm for 3 hours. Thus compound powders were obtained.

The compound powders were dried in a drying oven, under the nitrogen atmosphere at a temperature of 200° C. for 10 hours, thus obtaining drying powders.

The drying powders were sintered in a muffle furnace, under a temperature of 950° C. for 6 hours, and then were subjected to a drying grinding process to obtain a metal compound.

The average particle diameter of the metal compound was measured according to the above-identified test, and the metal compound was proved to have an average particle diameter of 1.3 μm.

The composition of the metal compound was measured according to the above-identified test, and the metal compound was proved to have the formula of $Cu_2Mo_{1.2}In_{0.8}O_{3.5}$.

The content of CuO in the metal compound was measured according to the above-identified test, and the content of CuO was proved to be 0.0017 mol %.

It was observed that the metal compound was light yellow, and has a hex color code of #FFFFE0, and a RGB color mode of 255, 255, 224.

2) Preparation of the Polymer Article

Polycarbonate, antioxidant 1098, stabilizer polyethylene (PE) wax and the metal compound obtained from the step 1) were mixed and granulated to form particles, in which based on 100 weight parts of the polycarbonate, the metal compound was 15 weight parts, the antioxidant was 0.5 weight parts and the stabilizer was 0.3 weight parts. The particles were injection molded in an injection molding machine, thus obtaining a polymer article (sheet) having a thickness of 2 mm.

It was observed that the polymer article was light yellow, and has a hex color code of #FFFFE0, and a RGB color mode of 255, 255, 224.

3) Forming the Metal Layer on the Polymer Article

A surface of the polymer article obtained from the step 2) was irradiated with a YLP-20 laser (commercially available from Hans Laser Company, China) under a condition of: a wavelength of 1064 nm, a scan speed of 1000 mm/s, a step of 6 μm, a time delay of 50 μs, a frequency of 35 kHz, a power of 3 kW and a filling distance of 20 μm. The movements of the laser beam and the polymer article were controlled with a computer program. Then the irradiated polymer article was cleaned and was subjected to chemical plating using a Cu solution containing: 5 g/L of $CuSO_4.5H_2O$, 25 g/L of potassium sodium tartrate, 7 g/L of NaOH, 10 g/L of formaldehyde and 0.1 g/L of a stabilizer. A metal layer (Cu layer) having a thickness of 3 μm was formed on the polymer article.

The plating speed was 6 μm/h.

The adhesion between the polymer article and the metal layer was measured according to the above-identified test, and the adhesion was proved to be ISO grade 1.

The degradability of the polymer articles obtained from steps 2) and 3) was measured according to the above-identified test, respectively, and the degradability was proved to be 20.01% and 22.25% respectively.

Example 4 (E4)

The present example included the following steps:

1) Preparation of the Metal Compound $Cu_2O$, $Cr_2O_3$, $Mo_2O_3$ and $Al_2O_3$ having a molar ratio of $Cu_2O$: $(Cr_2O_3+Mo_2O_3(Cr_2O_3/Mo_2O_3=1:1))$:$Al_2O_3$ being 1:0.3:0.7 were mixed to form a first mixture. Then the first mixture was subjected to a wet grinding process using water as the dispersant, in which based on 100 weight parts of the first mixture, the content of the water was 150 weight parts. The wet grinding process was performed under a rotation speed of 500 rpm for 5 hours. Thus compound powders were obtained.

The compound powders were dried in a drying oven, under the air atmosphere at a temperature of 200° C. for 10 hours, thus obtaining drying powders.

The drying powders were sintered in a muffle furnace, under a temperature of 800° C. for 2 hours, and then were subjected to a drying grinding process to obtain a metal compound.

The average particle diameter of the metal compound was measured according to the above-identified test, and the metal compound was proved to have an average particle diameter of 2 μm.

The composition of the metal compound was measured according to the above-identified test, and the metal compound was proved to have the formula of $Cu_2Cr_{0.3}Mo_{0.3}Al_{1.4}O_{3.3}$.

The content of CuO in the metal compound was measured according to the above-identified test, and the content of CuO was proved to be 0.0022 mol %.

It was observed that the metal compound was light blue, and has a hex color code of #87CEFA, and a RGB color mode of 135, 206, 250.

2) Preparation of the Polymer Article

Polycarbonate, antioxidant 1098, stabilizer polyethylene (PE) wax and the metal compound obtained from the step 1) were mixed and granulated to form particles, in which based on 100 weight parts of the polycarbonate, the metal compound was 40 weight parts, the antioxidant was 0.3 weight parts and the stabilizer was 0.6 weight parts. The particles were injection molded in an injection molding machine, thus obtaining a polymer article (sheet) having a thickness of 2 mm.

It was observed that the polymer article was light blue, and has a hex color code of #87CEFA, and a RGB color mode of 135, 206, 250.

3) Forming the Metal Layer on the Polymer Article

A surface of the polymer article obtained from the step 2) was irradiated with a YLP-20 laser (commercially available from Hans Laser Company, China) under a condition of: a wavelength of 1064 nm, a scan speed of 1000 mm/s, a step of 6 μm, a time delay of 50 μs, a frequency of 30 kHz, a power of 4 kW and a filling distance of 20 μm. The movements of the laser beam and the polymer article were controlled with a computer program. Then the irradiated polymer article was cleaned and was subjected to chemical plating using a Cu solution containing: 5 g/L of $CuSO_4.5H_2O$, 25 g/L of potassium sodium tartrate, 7 g/L of NaOH, 10 g/L of formaldehyde and 0.1 g/L of a stabilizer. A metal layer (Cu layer) having a thickness of 3 μm was formed on the polymer article.

The plating speed was 4 μm/h.

The adhesion between the polymer article and the metal layer was measured according to the above-identified test, and the adhesion was proved to be ISO grade 1.

The degradability of the polymer articles obtained from steps 2) and 3) was measured according to the above-identified test, respectively, and the degradability was proved to be 22.01% and 23.11% respectively.

Example 5 (E5)

The present example included the following steps:

1) Preparation of the Metal Compound $Cu_2O$, $Cr_2O_3$, $Ga_2O_3$ and $Al_2O_3$ having a molar ratio of $Cu_2O$: $(Cr_2O_3+Ga_2O_3(Cr_2O_3/Ga_2O_3=1:1))$:$Al_2O_3$ being 1:0.3:0.7 were mixed to form a first mixture. Then the first mixture was subjected to a wet grinding process using water as the dispersant, in which based on 100 weight parts of the first mixture, the content of the water was 150 weight parts. The wet grinding process was performed under a rotation speed of 500 rpm for 5 hours. Thus compound powders were obtained.

The compound powders were dried in a drying oven, under the air atmosphere at a temperature of 100° C. for 12 hours, thus obtaining drying powders.

The drying powders were sintered in a muffle furnace, under a temperature of 800° C. for 2 hours, and were then subjected to a drying grinding process to obtain a metal compound.

The average particle diameter of the metal compound was measured according to the above-identified test, and the metal compound was proved to have an average particle diameter of 2 μm.

The composition of the metal compound was measured according to the above-identified test, and the metal compound was proved to have the formula of $Cu_2Cr_{0.6}Ga_{0.7}Al_{0.7}O_{3.3}$.

The content of CuO in the metal compound was measured according to the above-identified test, and the content of CuO was proved to be 0.0033 mol %.

It was observed that the metal compound was light grey, and has a hex color code of #D3D3D3, and a RGB color mode of 211, 211, 211.

2) Preparation of the Polymer Article

Polycarbonate, antioxidant 1098, stabilizer polyethylene (PE) wax and the metal compound obtained from the step 1) were mixed and granulated to form particles, in which based on 100 weight parts of the polycarbonate, the metal compound was 40 weight parts, the antioxidant was 0.3 weight parts and the stabilizer was 0.4 weight parts. The particles were injection molded in an injection molding machine, thus obtaining a polymer article (sheet) having a thickness of 3 mm.

It was observed that the polymer article was light grey, and has a hex color code of # D3D3D3, and a RGB color mode of 211, 211, 211.

3) Forming the Metal Layer on the Polymer Article

A surface of the polymer article obtained from the step 2) was irradiated with a YLP-20 laser (commercially available from Hans Laser Company, China) under a condition of: a wavelength of 1064 nm, a scan speed of 1000 mm/s, a step of 6 μm, a time delay of 50 μs, a frequency of 30 kHz, a power of 4 kW and a filling distance of 20 μm. The movements of the laser beam and the polymer article were controlled with a computer program. Then the irradiated polymer article was cleaned and was subjected to chemical plating using a Cu solution containing: 5 g/L of $CuSO_4.5H_2O$, 25 g/L of potassium sodium tartrate, 7 g/L of NaOH, 10 g/L of formaldehyde and 0.1 g/L of a stabilizer. A metal layer (Cu layer) having a thickness of 4 μm was formed on the polymer article.

The plating speed was 5 μm/h.

The adhesion between the polymer article and the metal layer was measured according to the above-identified test, and the adhesion was proved to be ISO grade 1.

The degradability of the polymer articles obtained from steps 2) and 3) was measured according to the above-identified test, respectively, and the degradability was proved to be 30.1% and 33.1%.

Example 6 (E6)

The present example included the following steps:
1) Preparation of the Metal Compound The step 1) of Example 6 was performed substantially the same as that in the Example 1, with the difference that the average particle diameter of the metal compound was 80 nm.

2) Preparation of Ink Composition 100 g of the metal compound obtained from the step 1), 20 g of binder material CAB381-0.5 (commercially available from Eastman Chemical Company, US), 100 g of n-ethanol, 2 g of dispersing agent DISPERBYK-165 (commercially available from BYK Company, GE), 0.2 g of antifoaming agent BYK-051 (commercially available from BYK Company, GE), 0.4 g of leveling agent BYK-333 (commercially available from BYK Company, GE) and 0.5 g of hydrogenated castor oil (commercially available from Wuhan Jinnuo Chemical Company, China) were mixed uniformly to obtain an ink composition.

3) Forming Ink Layer on Insulative Substrate

The ink composition obtained from the step 2) was applied on a surface of an $Al_2O_3$ ceramic substrate by ink jet printing, and then the $Al_2O_3$ ceramic substrate applied with the ink composition was drying at a temperature of 120° C. for 3 hours, followed by heating at a temperature of 800° C. for 2 hours under a nitrogen atmosphere. Thus an ink layer was formed on the surface of the ceramic substrate.

4) Forming Metal Layer on the Ink Layer

The ceramic substrate obtained from the step 3) was subjected to chemical plating using a Cu solution containing: 5 g/L of $CuSO_4.5H_2O$, 25 g/L of potassium sodium tartrate, 7 g/L of NaOH, 10 g/L of formaldehyde and 0.1 g/L of a stabilizer. A metal layer (Cu layer) having a thickness of 2 μm was formed on the ink layer.

The plating speed was 90 μm/h.

The adhesion between the ceramic substrate and the metal layer was measured according to the above-identified test, and the adhesion was proved to be ISO grade 1.

Comparative Example 7 (CE7)

The Comparative Example 7 was performed substantially the same as the Example 6, with the difference that the metal compound was prepared according to the step 1) of the Comparative Example 1.

The results showed that the metal layer cannot be formed on the surface of the ceramic substrate.

Example 7 (E7)

The present example included the following steps:
1) Preparation of the Metal Compound The step 1) of Example 7 was performed substantially the same as that in the Example 2, with the difference that the average particle diameter of the metal compound was 100 nm.

2) Preparation of Ink Composition 100 g of the metal compound obtained from the step 1), 15 g of polyvinyl butyral Mowital (commercially available from Kuraray Company, JP) and 20 g of toluene were mixed uniformly to obtain an ink composition.

3) Forming Ink Layer on Insulative Substrate

The ink composition obtained from the step 2) was applied on a surface of a poly(ether-ether-ketone) (PEEK) substrate, and then the PEEK substrate applied with the ink composition was drying at a temperature of 150° C. for 4 hours. Thus an ink layer having a thickness of 25 μm was formed on the surface of the PEEK substrate.

4) Forming Metal Layer on the Ink Layer

The PEEK substrate obtained from the step 3) was subjected to chemical plating using a Cu solution containing: 5 g/L of $CuSO_4.5H_2O$, 25 g/L of potassium sodium tartrate, 7 g/L of NaOH, 10 g/L of formaldehyde and 0.1 g/L of a stabilizer. A metal layer (Cu layer) having a thickness of 4 μm was formed on the ink layer.

The plating speed was 86 μm/h.

The adhesion between the ceramic substrate and the metal layer was measured according to the above-identified test, and the adhesion was proved to be ISO grade 2.

Example 8 (E8)

The present example included the following steps:

1) Preparation of the Metal Compound

The step 1) of Example 8 was performed substantially the same as that in the Example 4, with the difference that the average particle diameter of the metal compound was 40 nm.

2) Preparation of Ink Composition 100 g of the metal compound obtained from the step 1), 30 g of EVA binder material (commercially available from Eastman Chemical Company, US), 110 g of toluene, 3 g of dispersing agent ANTI-TERRA-U 80 (commercially available from BYK Company, GE), 0.5 g of antifoaming agent BYK-065 (commercially available from BYK Company, GE), 0.5 g of leveling agent BYK-306 (commercially available from BYK Company, GE) and 0.4 g of hydroxyethyl cellulose (commercially available from Luzhou North Cellulose Co., Ltd., China) were mixed uniformly to obtain an ink composition.

3) Forming Ink Layer on Insulative Substrate

The ink composition obtained from the step 2) was applied on a surface of an polycarbonate (PC) substrate, and then the PC substrate applied with the ink composition was drying at a temperature of 150° C. for 4 hours. Thus an ink layer having a thickness of 15 μm was formed on the surface of the PC substrate.

4) Forming Metal Layer on the Ink Layer

The PC substrate obtained from the step 3) was subjected to chemical plating using a Cu solution containing: 5 g/L of CuSO$_4$.5H$_2$O, 25 g/L of potassium sodium tartrate, 7 g/L of NaOH, 10 g/L of formaldehyde and 0.1 g/L of a stabilizer. A metal layer (Cu layer) having a thickness of 3 μm was formed on the ink layer.

The plating speed was 94 μm/h.

The adhesion between the ceramic substrate and the metal layer was measured according to the above-identified test, and the adhesion was proved to be ISO grade 1.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A polymer article comprising:
a polymer matrix, and
particles dispersed in the polymer matrix, the particles comprising a metal compound having a formula (I)

$$Cu_2A_\alpha B_{2-\alpha}O_{4-\beta} \quad (I),$$

wherein
A comprises at least one element selected from the groups 6 and 8 of the periodic table,
B comprises at least one element selected from the group 13 of the periodic table,
$0.5 \leq \alpha < 2$,
$0 < \beta < 1.5$, and
if A is Fe, B is not Al.

TABLE 1

| | PD (μm) | Composition | CuO Content (mol %) | Color | Hex Color Code | RGB Color Mode | PS (μm/h) | Ad. (ISO grade) | De.1 (%) | De.2 (%) |
|---|---|---|---|---|---|---|---|---|---|---|
| E1 | 2 | Cu2Cr0.6Al1.4O3.3 | 0.0027 | Light blue | #87CEFA | 135, 206, 250 | 5 | 1 | 20.01 | 20.11 |
| CE1 | 2 | CuCrAlO4 | 0.008 | Black | #000000 | 0, 0, 0 | 2 | 4 | 34.12 | 35.11 |
| CE2 | 2 | CuCr0.3Al0.7O4 | 0.1075 | Black | #000000 | 0, 0, 0 | 2 | 4 | 70.12 | 73.11 |
| CE3 | 2 | Cu2ZnAlO3.5 | 0.0055 | Dark green | #006400 | 0, 100, 0 | 4 | 3 | 33.02 | 33.15 |
| CE4 | 2 | Cu2Cr0.4Si1.6O4 | 0.0073 | Dark brown | #800000 | 128, 0, 0 | 1 | 3 | 44.35 | 45.25 |
| CE5 | 2 | CuCrO2 | 0.0035 | Dark green | #006400 | 0, 100, 0 | 4 | 2 | 25.68 | 26.35 |
| CE6 | 2 | CuCrAlO4 | 0.0075 | Black | #000000 | 0, 0, 0 | 2 | 4 | 37.25 | 37.55 |
| E2 | 1.5 | Cu2FeGaO3.9 | 0.0015 | Light green | #90EE90 | 144, 238, 144 | 5 | 1 | 19.02 | 19.52 |
| E3 | 1.3 | Cu2Mo1.2In0.8O3.5 | 0.0017 | Light yellow | #FFFFE0 | 255, 255, 224 | 6 | 1 | 21.01 | 22.25 |
| E4 | 2 | Cu2Cr0.3Mo0.3Al1.4O3.3 | 0.0022 | Light blue | #87CEFA | 135, 206, 250 | 4 | 1 | 22.01 | 23.11 |
| E5 | 2 | Cu2Cr0.6Ga0.7Al0.7O3.3 | 0.0033 | Light gray | #D3D3D3 | 211, 211, 211 | 5 | 1 | 30.1 | 33.1 |
| E6 | 0.08 | Cu2Cr0.6Al1.4O3.3 | 0.0027 | Light blue | #87CEFA | 135, 206, 250 | 90 | 1 | | |
| CE7 | 0.08 | Cu2Cr0.6Al1.4O3.3 | 0.0027 | Light blue | #87CEFA | 135, 206, 250 | / | / | / | / |
| E7 | 0.1 | Cu2FeGaO3.9 | 0.0015 | Light green | #90EE90 | 144, 238, 144 | 86 | 2 | | |
| E8 | 0.04 | Cu2Cr0.3Mo0.3Al1.4O3.3 | 0.0022 | Light blue | #87CEFA | 135, 206, 250 | 94 | 1 | | |

2. The polymer article according to claim 1, wherein A comprises at least one element selected from a group consisting of Cr, Mo and Fe.

3. The polymer article according to claim 1, wherein B comprises at least one element selected from a group consisting of Al, Ga and In.

4. The polymer article according to claim 1, wherein the metal compound further comprises CuO, and based on the total weight of the metal compound, the content of the CuO is less than about 0.01 mol %.

5. The polymer article according to claim 1, wherein the particles have an average particle diameter of about 0.01 μm to about 5 μm.

6. The polymer article according to claim 1, wherein based on the total weight of the polymer article, the content of the metal compound is about 1 wt % to about 30 wt %.

7. The polymer article according to claim 1, wherein B comprises Al.

8. The polymer article according to claim 1, wherein B comprises In.

9. The polymer article according to claim 1, wherein A comprises Cr and/or Mo.

10. The polymer article according to claim 1, wherein the metal compound comprises at least one selected from a group consisting of $Cu_2Cr_{0.6}Al_{1.4}O_{3.3}$, $Cu_2FeGaO_{3.9}$, $Cu_2Mo_{1.2}In_{0.8}O_{3.5}$, $Cu_2Cr_{0.5}Al_{1.5}O_3$, $Cu_2Mo_{0.5}Al_{1.5}O_3$, $Cu_2Cr_{0.8}Ga_{1.2}O_{3.9}$, $Cu_2Cr_{1.1}Al_{0.9}O_{3.5}$, $Cu_2Fe_{0.5}In_{1.5}O_3$, $Cu_2Cr_{0.5}Ga_{1.5}O_{2.8}$, $Cu_2Cr_{0.3}Mo_{0.3}Al_{1.4}O_{3.3}$ and $Cu_2Cr_{0.6}Ga_{0.7}Al_{0.7}O_{3.3}$.

11. A polymer article comprising:
a polymer matrix, and
particles dispersed in the polymer matrix, the particles comprising a metal compound having a formula (I)

$$Cu_2A_\alpha B_{2-\alpha}O_{4-\beta} \qquad (I),$$

wherein
A comprises at least one element selected from the groups 6 and 8 of the periodic table,
B comprises Al and/or In,
$0<\alpha<2$,
$0<\beta<1.5$, and
if A is Fe, B is not Al.

12. The polymer article according to claim 11, wherein A comprises Cr and/or Mo.

13. The polymer article according to claim 11, wherein B comprises In.

14. The polymer article according to claim 11, wherein the metal compound further comprises CuO, and based on the total weight of the metal compound, the content of the CuO is less than about 0.01 mol %.

15. The polymer article according to claim 11, wherein the particles have an average particle diameter of about 0.01 μm to about 5 μm.

16. A polymer article comprising:
a polymer matrix, and
particles dispersed in the polymer matrix, the particles comprising a metal compound having a formula (I)

$$Cu_2A_\alpha B_{2-\alpha}O_{4-\beta} \qquad (I),$$

wherein
A comprises Cr and/or Mo,
B comprises at least one element selected from the group 13 of the periodic table,
$0<\alpha<2$, and
$0<\beta<1.5$.

17. The polymer article according to claim 16, wherein B comprises Al and/or In.

18. The polymer article according to claim 16, wherein B comprises In.

19. The polymer article according to claim 16, wherein the metal compound further comprises CuO, and based on the total weight of the metal compound, the content of the CuO is less than about 0.01 mol %.

20. The polymer article according to claim 16, wherein the particles have an average particle diameter of about 0.01 μm to about 5 μm.

* * * * *